(12) United States Patent
Van Der Wiel et al.

(10) Patent No.: US 11,785,865 B2
(45) Date of Patent: Oct. 10, 2023

(54) SEMICONDUCTOR DEVICE WITH INTEGRATED MAGNETIC FLUX CONCENTRATOR, AND METHOD FOR PRODUCING SAME

(71) Applicant: Melexis Technologies SA, Bevaix (BE)

(72) Inventors: Appo Van Der Wiel, Tessenderlo (BE); Yves Bidaux, Bevaix (CH); Lionel Tombez, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 17/519,809

(22) Filed: Nov. 5, 2021

(65) Prior Publication Data

US 2022/0165935 A1 May 26, 2022

(30) Foreign Application Priority Data

Nov. 23, 2020 (EP) .................................... 20209345

(51) Int. Cl.
*G01R 33/07* (2006.01)
*H10N 52/00* (2023.01)
*H10N 50/80* (2023.01)

(52) U.S. Cl.
CPC ......... *H10N 52/101* (2023.02); *G01R 33/072* (2013.01); *H10N 50/80* (2023.02)

(58) Field of Classification Search
CPC ....... H01L 43/065; H01L 43/02; H01L 43/14; G01R 33/077; G01R 33/072; G01R 33/07
See application file for complete search history.

(56) References Cited

U.S. PATENT DOCUMENTS

| 4,339,875 A | 7/1982 | Mueller |
| 2002/0021124 A1 | 2/2002 | Schott et al. |

(Continued)

FOREIGN PATENT DOCUMENTS

| EP | 2006700 A2 | 12/2008 |
| EP | 3276365 A1 | 1/2018 |
| EP | 3470863 A1 | 4/2019 |

OTHER PUBLICATIONS

Extended Search Report from corresponding EP Application No. 20205330.2, dated Apr. 13, 2021.

(Continued)

*Primary Examiner* — Dominic E Hawkins
(74) *Attorney, Agent, or Firm* — WORKMAN NYDEGGER

(57) ABSTRACT

A method of producing a semiconductor substrate comprising at least one integrated magnetic flux concentrator, comprising the steps of: a) providing a semiconductor substrate having an upper surface; b) making at least one cavity in said upper surface; c) depositing one or more layers of one or more materials, including sputtering at least one layer of a soft magnetic material; d) removing substantially all of the soft magnetic material that is situated outside of the at least one cavity, while leaving at least a portion of the soft magnetic material that is inside said at least one cavity. A semiconductor substrate comprising at least one integrated magnetic flux concentrator. A sensor device or a sensor system, a current sensor device or system, a position sensor device or system, a proximity sensor device or system, an integrated transformer device or system.

17 Claims, 12 Drawing Sheets

(56) References Cited

U.S. PATENT DOCUMENTS

| | | | |
|---|---|---|---|
| 2006/0255797 A1* | 11/2006 | Taylor | G01R 15/207 |
| | | | 324/262 |
| 2007/0146929 A1* | 6/2007 | Maruyama | G11B 5/3146 |
| 2009/0123781 A1* | 5/2009 | Uchida | G11B 5/8404 |
| | | | 428/827 |
| 2009/0152119 A1* | 6/2009 | Tachibana | G11B 5/315 |
| | | | 205/127 |
| 2009/0309590 A1* | 12/2009 | Kataoka | H01L 27/22 |
| | | | 257/E21.09 |
| 2011/0244599 A1 | 10/2011 | Whig et al. | |
| 2013/0015839 A1* | 1/2013 | Franke | G01R 15/202 |
| | | | 324/117 H |
| 2014/0167749 A1 | 6/2014 | Kim et al. | |
| 2017/0271575 A1 | 9/2017 | Hioka et al. | |
| 2020/0386830 A1* | 12/2020 | Endo | H01L 43/02 |

OTHER PUBLICATIONS

Extended Search Report from corresponding EP Application No. 20209345.6, dated May 14, 2021.

* cited by examiner

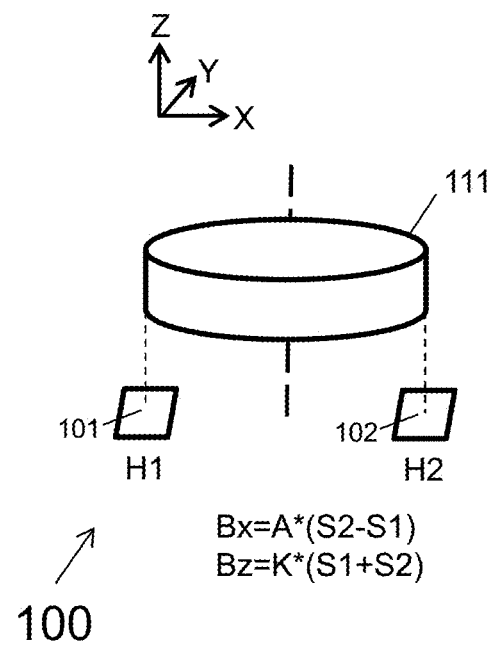
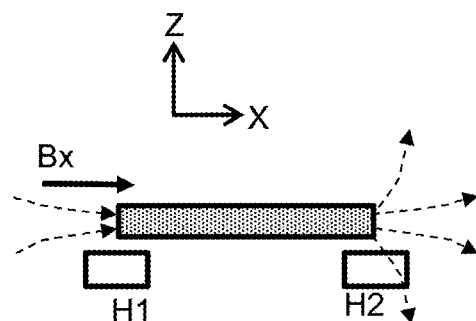
FIG 1(a) FIG 1(b)
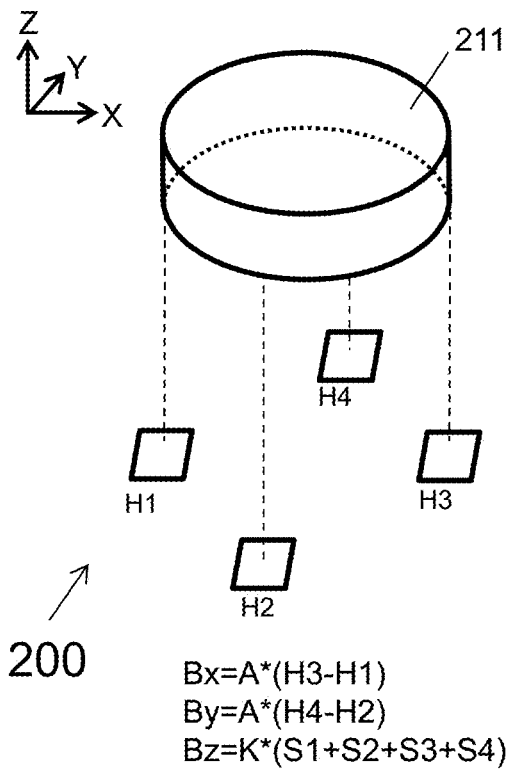
FIG 2

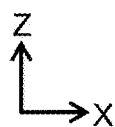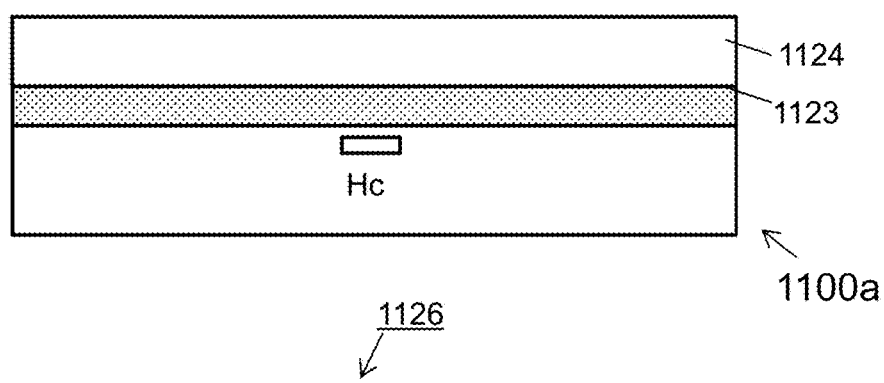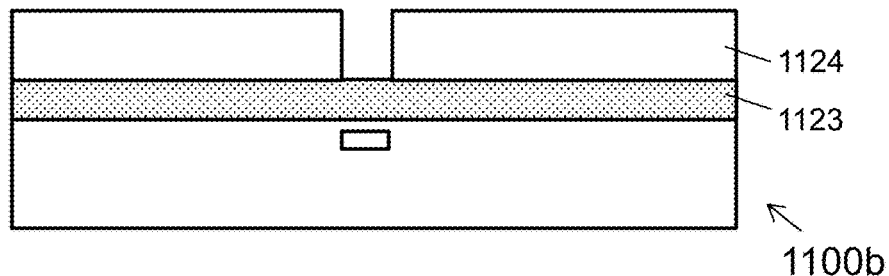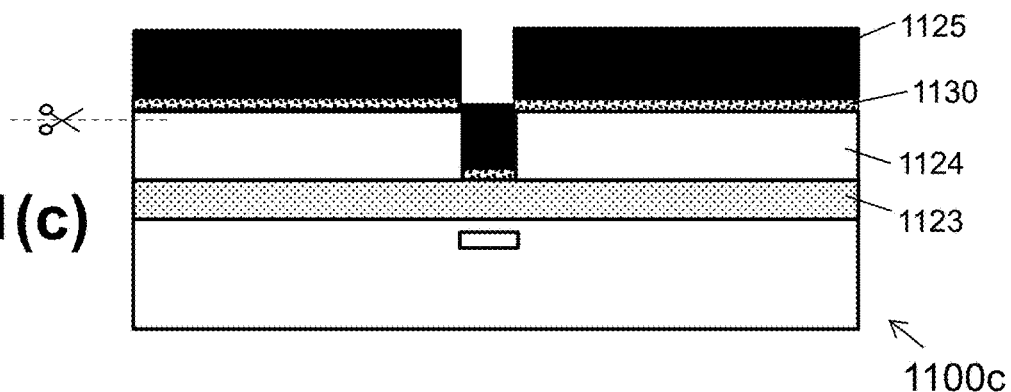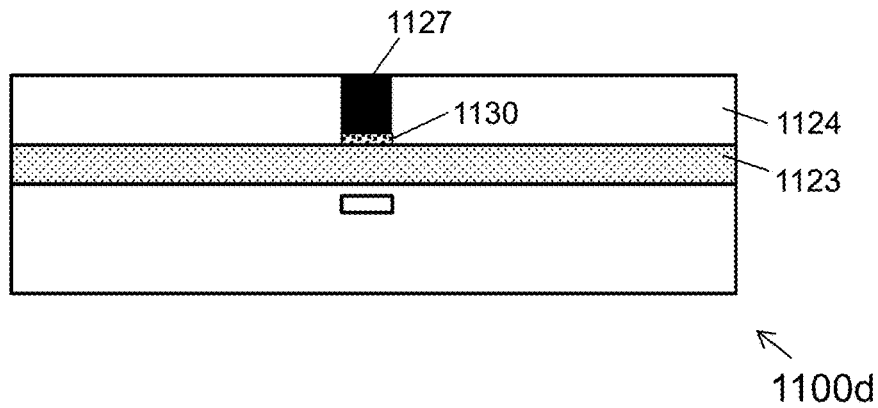

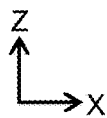
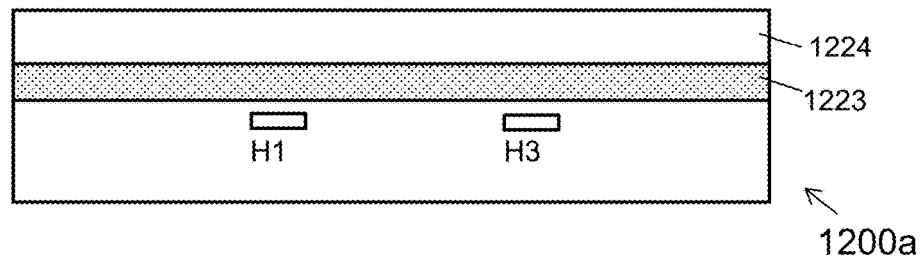
FIG 12(a)
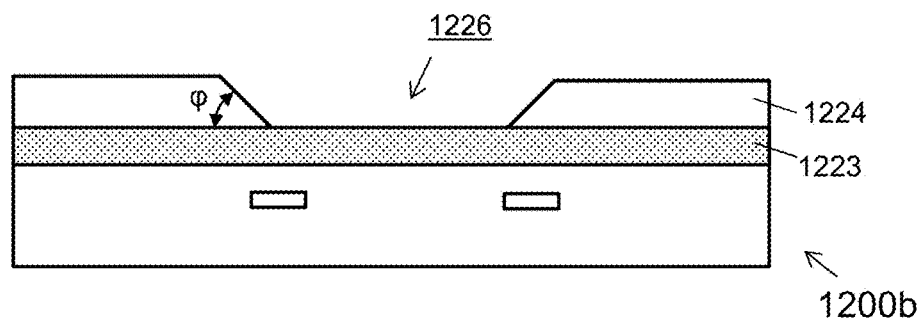
FIG 12(b)
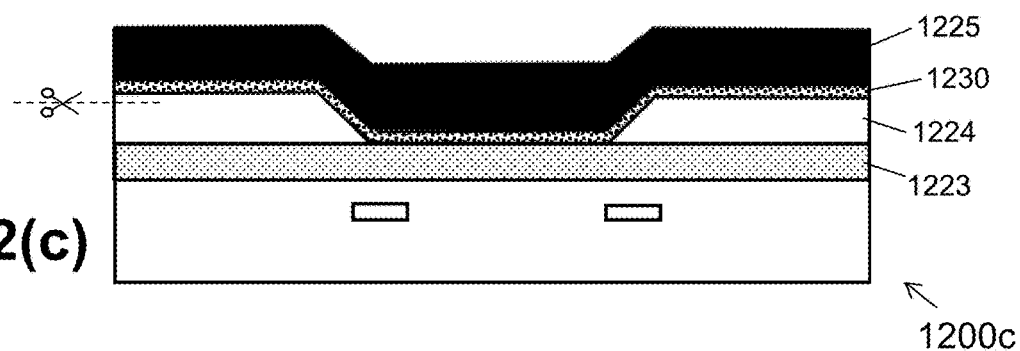
FIG 12(c)
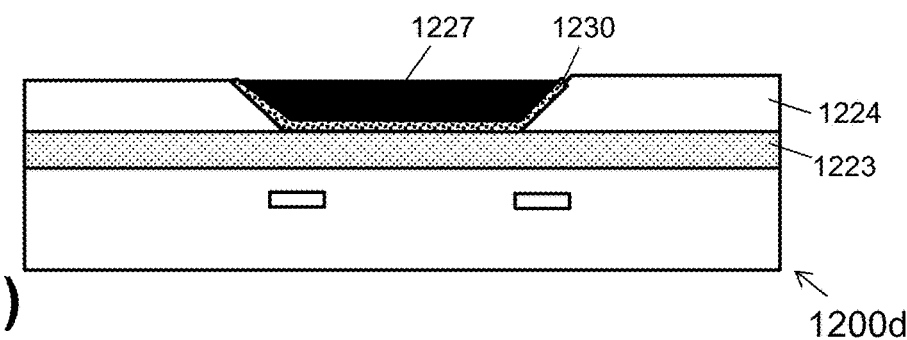
FIG 12(d)

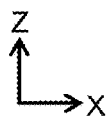
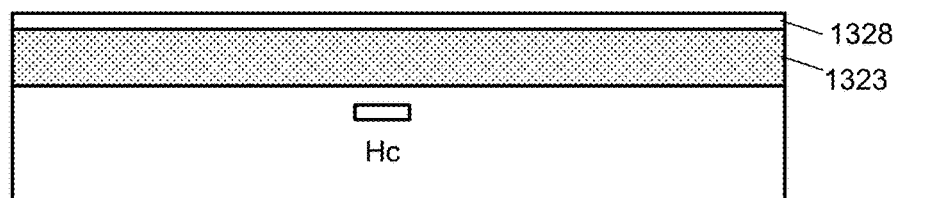
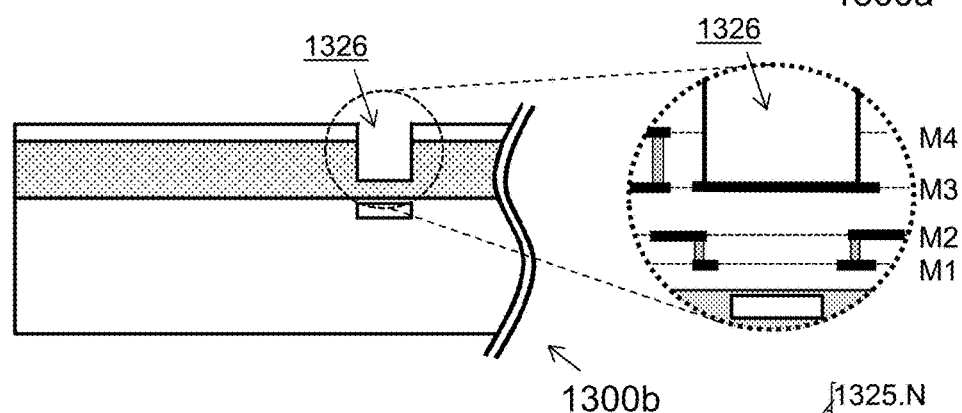
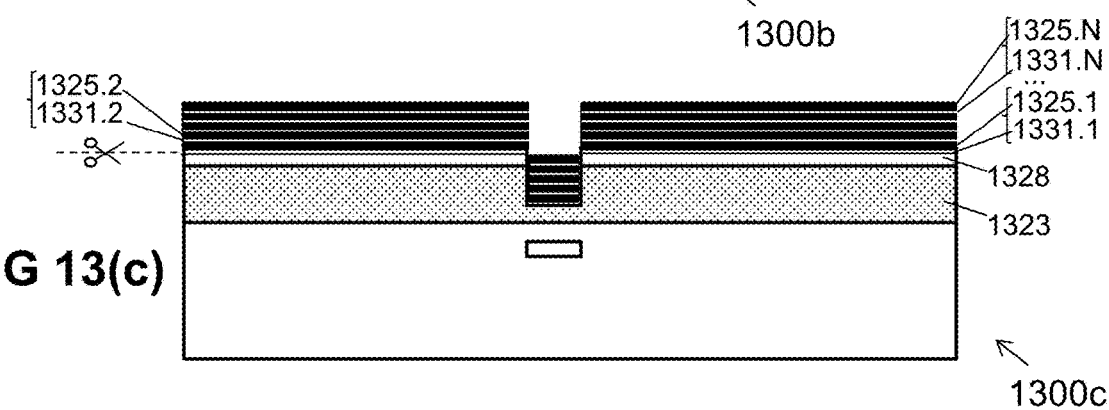
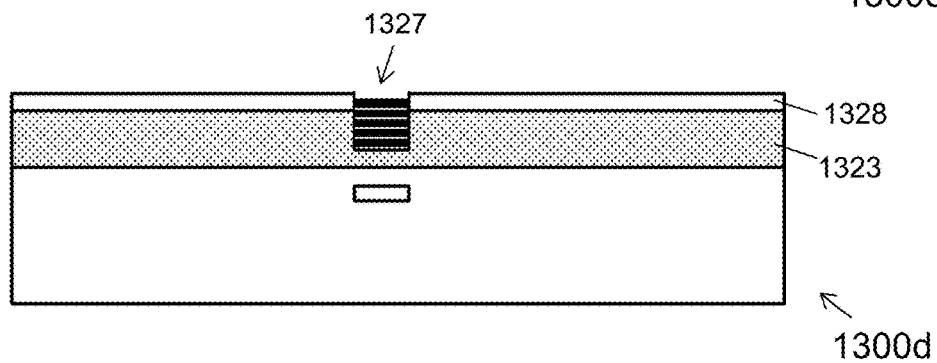

SEMICONDUCTOR DEVICE WITH INTEGRATED MAGNETIC FLUX CONCENTRATOR, AND METHOD FOR PRODUCING SAME

FIELD OF THE INVENTION

The present invention relates in general to the field of semiconductor devices with Integrated Magnetic Flux Concentrators (IMFC or IMC), and to methods of producing such devices. More specifically, the present invention relates to the field of semiconductor devices comprising at least one horizontal Hall element and at least one integrated magnetic flux concentrator, and methods of producing such devices.

BACKGROUND OF THE INVENTION

Semiconductor devices (e.g. magnetic sensor devices) comprising a semiconductor substrate and at least one horizontal Hall element, and at least one Integrated Magnetic Flux Concentrator (IMFC or IMC) are known in the art, for example from US2002021124(A1), filed about 20 years ago. Examples of such devices are linear position sensor devices, angular position sensor devices, current sensor devices, etc.

It is known that a horizontal Hall element (without IMC on top) can be used to measure a magnetic field component (Bz) oriented perpendicular to a semiconductor substrate, and that vertical Hall elements and magneto-resistive elements can measure a magnetic field component (Bx, By) parallel to the semiconductor substrate.

It is also known (from patent documents) that two horizontal Hall elements arranged on opposite sides and near the periphery of a magnetic disc, can be used to measure a magnetic field component (Bx or By) oriented parallel to a semiconductor substrate.

Over the years many variants of sensor devices comprising one or more horizontal Hall elements and one or more Integrated Magnetic Flux Concentrators (IMFC) have been developed, but the way in which the IMFC is implemented in these devices, has not seen many changes, other than tape being replaced by electroplating.

There is always room for improvements or alternatives.

SUMMARY OF THE INVENTION

It is an object of embodiments of the present invention to provide a method of producing a semiconductor substrate (e.g. a semiconductor wafer or a semiconductor die) comprising at least one integrated magnetic flux concentrator (abbreviated as IMFC or IMC).

It is also an object of embodiments of the present invention to provide a semiconductor substrate (e.g. a semiconductor wafer or a semiconductor die), and a semiconductor device comprising such a semiconductor substrate, more in particular a magnetic sensor device.

It is an object of embodiments of the present invention to provide a method of producing a semiconductor device comprising at least one coil and an integrated magnetic core, or at least one transmitter coil and at least one receiver coil and an integrated magnetic core.

It is an object of embodiments of the present invention to provide a method of producing a semiconductor device comprising at least one horizontal Hall element and at least one integrated magnetic flux concentrator (IMFC or IMC).

It is an object of embodiments of the present invention to provide a method of producing a semiconductor device comprising a plurality of integrated magnetic flux concentrators (IMFC), which has an increased life-time and/or an improved reliability when used in automotive applications (e.g. when used in an industrial or automotive environment).

It is an object of embodiments of the present invention to provide a method of producing a semiconductor wafer comprising a plurality of integrated magnetic flux concentrators (IMFC) having a thickness or a total thickness (in the direction perpendicular to the semiconductor wafer) in the range from 1.0 to 10 µm, or from 1.0 to 100 µm, or from 1.5 to 100 µm, or from 2.0 to 100 µm, or from 5.0 to 100 µm, or from 10 µm to 100 µm, or from 15 µm to 100 µm, or from 20 µm to 100 µm, or from 25 µm to 100 µm, or from 30 µm to 100 µm, or from 35 µm to 100 µm, or from 40 µm to 100 µm, or from 55 µm to 100 µm, or from 50 µm to 100 µm, preferably while maintaining good mechanical properties (e.g. with a small risk of detaching or de-laminating) and/or while maintaining good magnetic properties (e.g. saturation, hysteresis) and/or while maintaining a good reliability (e.g. long life-time) even when used in an industrial or automotive environment.

It is an object of embodiments of the present invention to provide a method of producing a semiconductor wafer comprising a plurality of integrated magnetic flux concentrators (IMFC) which is compatible with the CMOS process.

It is an object of embodiments of the present invention to provide a method of producing one or more of the following devices: a current sensor device, an integrated transformer device (also referred to as "micro-transformer" device), an integrated proximity sensor device, an integrated magnetic sensor device, an integrated angular sensor device, an integrated linear sensor device, optionally packaged in a single chip.

It is an object of embodiments of the present invention to provide an integrated magnetic sensor device capable of measuring one or more characteristics of a magnetic field with an increased signal-to-noise ratio (SNR), and/or with an improved accuracy, and/or with a larger signal amplitude, without having to increase power consumption, and a method of producing such an integrated magnetic sensor device.

It is an object of embodiments of the present invention to provide such an integrated magnetic sensor device, or such a position sensor device that is suitable for use in an industrial and/or automotive environment.

It is an object of particular embodiments of the present invention to provide an integrated magnetic sensor device having an improved signal-to-noise-ratio, in particular for Bz-components oriented in a direction perpendicular to the semiconductor substrate.

It is an object of particular embodiments of the present invention to provide an integrated magnetic sensor device having a plurality of integrated magnetic concentrators with at least two different heights (measured in a direction perpendicular to the semiconductor substrate).

It is an object of particular embodiments of the present invention to provide an integrated magnetic sensor device having a reduced risk for delamination when used in industrial or automotive applications.

It is an object of particular embodiments of the present invention to provide an integrated magnetic sensor device causing less losses or less heating of the device.

It is an object of particular embodiments of the present invention to provide an integrated magnetic sensor device providing an improved production yield.

These and other objectives are accomplished by embodiments of the present invention.

According to a first aspect, the present invention provides a method of producing a semiconductor substrate (e.g. a semiconductor wafer or a semiconductor die) comprising at least one integrated magnetic flux concentrator, the method comprising the steps of: a) providing a semiconductor substrate having an upper surface; b) making at least one cavity in said upper surface; c) depositing one or more layers of one or more materials, including sputtering at least one layer of a soft magnetic material; d) removing substantially all of the soft magnetic material that is situated outside of the at least one cavity, while leaving at least a portion of the soft magnetic material that is inside said at least one cavity.

It is a major advantage that, when using this method, the "filling rate" or "coverage area" of the soft magnetic material, or the percentage of the projected area containing IMFC relative to the total area (with or without IMFC) can be larger than for example 4%, or larger than about 7%, or larger than about 10%, while maintaining a good production yield. The "upper surface" referred to is located on the same side as the "active surface" comprising integrated semiconductor components, e.g. preferably at least one horizontal Hall element. Example of semiconductor substrates obtained by this method are shown in FIG. 10(d), FIG. 11(d), FIG. 12(d), FIG. 13(d) and FIG. 14(d).

In an embodiment, step d) comprises: removing substantially all of the soft magnetic material that is situated outside of the at least one cavity, while leaving at least 50% or at least 60% or at least 70% or at least 80% or at least 90% or substantially all of the soft magnetic material that is situated inside said at least one cavity.

In an embodiment, step a) may comprise: providing a semiconductor substrate having a sacrificial layer at its upper surface, (e.g. as its top layer), and/or growing or depositing an insulating layer (e.g. SiO2 or SiNi or SU-8) on top of the semiconductor substrate, which insulating layer then becomes the (new) upper surface (or top layer).

In an embodiment, step d) comprises: removing the sacrificial layer, thereby also removing the soft magnetic material that was deposited outside of the cavities, on said sacrificial layer.

In an embodiment, the soft magnetic material may be selected from the group consisting of: Fe, Fe-alloy, Ni, Ni-alloy, FeNi, FeNi-alloy, Co, Co-alloy, metal-glass, mu-metal.

In an embodiment, step a) comprises: providing a semiconductor substrate with at least one Horizontal Hall element.

In an embodiment, step a) comprises: providing a semiconductor substrate with at least two Horizontal Hall elements.

In an embodiment, step d) comprises removing substantially all of the soft magnetic material that is situated outside of the at least one cavity by applying chemical mechanical polishing (CMP).

The inventors came to the idea of building cavities, and filling them with a soft magnetic material, and then apply CMP to remove the excess soft magnetic material outside of the cavities, as a way to "pattern" magnetic structures on the substrate. It is noted that CMP is normally used to flatten a surface.

Moreover, if the cavity is not completely filled, but only partially filled, the polishing does not necessary reach the top of the soft magnetic material inside the cavity. In this way it can be avoided that the polishing has a negative effect on the properties of the magnetic material in the cavities.

Example of semiconductor substrates obtained by this method are shown in FIG. 10(d), FIG. 11(d), FIG. 12(d) and FIG. 13(d).

In an embodiment, step d) comprises removing substantially all of the soft magnetic material that is situated outside of the at least one cavity by applying lift-off.

This may comprise: inserting the semiconductor substrate in a bath that will dissolve the sacrificial layer, in particular underneath the excess soft magnetic material, which will then also be removed from the substrate. An example of a semiconductor substrate obtained by this method is shown in FIG. 14(d).

In an embodiment, step b) comprises: applying a photoresist layer on the upper surface, and patterning the photoresist layer.

As is known in the art, "patterning the photoresist" may comprise: (i) exposing portions of the photoresist, or illuminating the photoresist with a mask; (ii) optionally baking the photoresist, and (iii) developing or etching the photoresist by removing the portions that were exposed or were not exposed.

In an embodiment, step b) comprises: making said at least one cavity so as to have a predefined first height (H1) in a direction perpendicular to the semiconductor substrate; and wherein step c) comprises: depositing said one or more layers over a second height (H2) in said direction perpendicular to the semiconductor substrate; wherein the second height (H2) is larger than the first height (H1).

It is an advantage when the second height (of the IMFC) is smaller than the first height (of the cavity), because in this case the sputtered soft magnetic material may exhibit superior characteristics, e.g. in terms of a reduced hysteresis, as compared to (i) a similar process/device where the soft magnetic material is deposited by electroplating, and/or as compared to (ii) a similar process/device where an upper surface of the IMFC has come into physical contact with a mechanical polishing device.

The difference between the first height and a second height may be chosen dependent on the roughness of the mechanical polishing being used.

In case step d) comprises using a lift-off process, making the second height (of the IMFC) smaller than the first height (of the cavity) offers the advantage that any (unwanted) interconnection between the IMFC deposited inside the cavity and any excess IMFC material on top of the sacrificial layer is relatively thin and weak, and will break when the material underneath the excess IMFC is dissolved.

In an embodiment, the second height is at least 1 μm smaller than the first height, or at least 2 μm, or at least 3 μm, or at least 4 μm, or at least 5 μm.

In an embodiment, the second height is substantially equal to the first height, within a tolerance margin of ±1 μm.

In an embodiment, the second height is larger than the first height, for example at least 1 μm higher, or at least 2 μm, or at least 3 μm, or at least 4 μm, or at least 5 μm. It is an advantage when the second height (of the IMFC) is larger than the first height (of the cavity), because in this case the upper surface will be flat after polishing (CMP), thus, the top of the IMFC will be highly planar.

In an embodiment, the second height is a value in the range from about 2.0 μm to about 80 μm.

In an embodiment, step a) comprises: providing a semiconductor substrate comprising at least one magnetic sensor element, and an interconnection stack comprising at least three or at least four metal layers; and wherein step b) comprises: making said at least one cavity so as to extend at least partially into said interconnection stack. This offers the advantage that a bottom of the magnetic flux concentrator will be located closer to the magnetic sensor element, yielding a larger signal. An example of a semiconductor substrate obtained by this method is shown in FIG. 13(*d*).

In an embodiment, step b) comprises: making said at least one cavity so as to extend to one of the metal layers of the interconnection stack. In this embodiment, one of the metal layers is used as an etch stop. This offers the advantage that the distance between the magnetic flux concentrator and the magnetic sensor element is smaller and/or very well-defined. This in turn may help to improve the accuracy of the sensor device e.g. by providing a larger gain, and thus a larger Signal-to-Noise ratio (NSR). It may also help to avoid the need for a calibration test during production. An example of a semiconductor substrate obtained by this method is shown in FIG. 13(*d*).

In an embodiment, step b) comprises: making a plurality of cavities, such that a total projected area (in a direction perpendicular to the semiconductor substrate) of the cavities amounts to at least 5%, or at least 7%, or at least 10%, or at least 12%, or at least 14%, or at least 16%, or at least 18%, or at least 20%, or at least 23%, or at least 25%, or at least 28%, or at least 30%, or at least 35%, or at least 40% of the total area of the semiconductor substrate. It is a major advantage of using sputtering to deposit the soft magnetic material, because sputtering does not really impose an upper limit to the maximum coverage area, in contrast to e.g. electroplating, which becomes very difficult or even impossible to use.

In an embodiment, step c) comprises: depositing a polymer layer, or a stress release layer (e.g. a layer comprising or consisting of Al or AlN or Al2O3 or SiO2 or Ta2O5 or an Al-based or Si-based or Ta-based material) as a first layer of said one or more layers. Applying a polymer layer, e.g. a polyimide layer can help to reduce mechanical stress between the at least one layer of sputtered soft magnetic material and materials in direct contact thereto (e.g. at the bottom, and/or at the sides). In this way the lifetime of the semiconductor device thus produced can be increased. An Aluminum (Al) or Aluminum-nitride (AlN) or Al2O3 or SiO2 or Ta2O5 layer, etc. may be deposited by sputtering. Examples of semiconductor substrates obtained by this method are shown in FIG. 11(*d*), in FIG. 12(*d*) and in FIG. 13(*d*).

In an embodiment, the polymer layer (1130) is a polyimide layer. The polyimide layer is typically deposited by spin coating.

In an embodiment, step c) comprises: providing at least one layer of Al or AlN or Al2O3 or SiO2 or Ta2O5 or an Al-based or Si-based or Ta-based material directly below said layer of soft magnetic material; and/or providing at least one layer of Al or AlN or Al2O3 or SiO2 or Ta2O5 or an Al-based or Si-based or Ta-based material directly on top of said layer of soft magnetic material. An example of a semiconductor substrate obtained by this method is shown in FIG. 13(*d*).

In an embodiment, step c) comprises: forming a stack of layers by repeating at least two times:
(i) sputtering a stress release layer (e.g. comprising or consisting of Al or AlN or Al2O3 or SiO2 or Ta2O5 or an Al-based or Si-based or Ta-based material); and (ii) sputtering a layer of a soft magnetic material.

The stress-release layer (e.g. Al or AlN or Al2O3 or SiO2 or Ta2O5 or an Al-based or Si-based or Ta-based material) may have a thickness from about 0.5 nm to about 40 nm, or from about 1.0 nm to about 40 nm, or from about 1.0 nm to about 20 nm, or from about 1.0 nm to about 10 nm, or from about 2.0 nm to about 20 nm, or from about 2.0 nm to about 10 nm, or from about 2.0 nm to about 4.0 nm, for example equal to about 2 nm, or equal to about 3 nm, or equal to about 4 nm, or equal to about 5 nm.

The layers of the soft magnetic material may have a thickness from about 50 nm to about 1000 nm, or from about 50 nm to about 500 nm, or from about 50 nm to about 200 nm, or from about 50 nm to about 75 nm, or from about 75 nm to about 100 nm, or from about 100 nm to about 125 nm, or from about 125 nm to about 150 nm, or from about 150 nm to about 200 nm, or from about 200 nm to about 250 nm, or from about 250 nm to about 300 nm, or from about 300 nm to about 350 nm, or from about 350 nm to about 400 nm, or from about 400 nm to about 450 nm, or from about 450 nm to about 500 nm. It is an advantage of providing such a multi-layer stack in that it can help to reduce mechanical stress between the at least two layers of sputtered soft magnetic material and materials in direct contact thereto (e.g. at the bottom, at the top, and/or at the sides). In this way the wear can be reduced, and the lifetime of the semiconductor device thus produced can be increased.

It is an advantage that this stack offers good mechanical properties (e.g. a reduced risk for delamination) and/or good magnetic properties (e.g. one or more of: a good magnetic gain, a relatively small hysteresis, a relatively large saturation, etc.).

It is a particular advantage when using AlN or another electrically isolation material as stress-release layer, because in this way the plurality of the magnetic material layers are electrically isolated from each other, hence eddy currents can only flow inside the individual layers. This means that heating due to eddy currents when subjected to a time-varying magnetic field (e.g. when measuring an AC current) is reduced (for at least some field orientations), hence thermal differences, and hence also mechanical stress will be reduced, mechanical wear will be reduced and the lifetime will be longer.

In an embodiment, step c) comprises repeating the steps of depositing a stress-release layer and a soft magnetic material layer at least 3 times, or at least 4 times, or at least 5 times, or at least 10 times, or at least 12 times, or at least 15 times, or at least 20 times.

In an embodiment, step b) comprises: making said at least one cavity with inclined sidewalls forming an angle (φ) with the semiconductor substrate different from 90°.

The inclined sidewalls may define an angle with respect to the semiconductor substrate in the range from about 30° to about 85°, or in the range from about 45° to about 85°, or in the range from about 60° to about 85°, or in the range from about 75° to about 85°. The inclined sidewalls may for example be formed by anisotropic etching, or anisotropic wet etching, or in any other suitable way.

An example of a semiconductor substrate obtained by this method is shown in FIG. 12(*d*).

In an embodiment, step b) comprises: making said at least one cavity with rounded or curved sidewalls, (e.g. by isotropic etching).

In an embodiment, the method comprising: making a cavity with inclined side walls in step b), and providing a stress-release layer in step c), e.g. comprising or consisting of polyimide, Al or AlN or Al2O3 or SiO2 or Ta2O5 or an Al-based or Si-based or Ta-based material. This is particularly advantageous, in that it not only reduces mechanical stress exerted by a layer located underneath the soft magnetic material layer, but also reduces mechanical stress exerted by a layer situated on the side of the soft magnetic material layer. An example of a semiconductor substrate obtained by this method is shown in FIG. 12(d). It is noted that the features of "inclined side-walls" and "presence of a stress-release layer", when both present, work synergistically, but they may also be used separately.

In an embodiment, step a) comprises: providing a semiconductor substrate comprising at least one or at least two horizontal Hall elements; and step b) comprises: making said at least one cavity above said at least one or said at least two horizontal Hall elements, such that the cavity has a shape with an outer edge which is substantially aligned with (i.e. is substantially located vertically above) a geometric centre of said at least one or said at least two horizontal Hall elements.

In an embodiment, the cavity has a disc shape or a ring shape, and the semiconductor substrate comprises at least two horizontal Hall elements, situated below and on opposite sides of the cavity. This embodiment is ideally suited for measuring a magnetic field component Bx or By oriented parallel to the semiconductor substrate.

In an embodiment, step a) comprises: providing a semiconductor substrate comprising at least one horizontal Hall element; and step b) comprises: making said at least one cavity above said horizontal Hall element, such that the cavity has a shape with a geometric center which is aligned with a geometric centre of the horizontal Hall element.

The shape of the cavity may have a height H in a direction (Z) perpendicular to the semiconductor substrate, and may have a largest transversal dimension D, (e.g. a diameter of a circle, or a largest diagonal of a polygonal shape) in a direction (X, Y) parallel to the semiconductor substrate. In an embodiment, the height of the cavity is at least 25 µm, or at least 27 µm, or at least 30 µm, or at least 32 µm, or at least 35 µm, or at least 40 µm, or at least 45 µm, or at least 50 µm, or at least 60 µm. In another or a further embodiment, a ratio (H/D) of the height (H) and said largest transversal dimension (D) is at least 25%, or at least 30% or at least 40% or at least 50% or at least 60%, or at least 70%, or at least 80%, or at least 90%, or at least 100%, or at least 110%.

Embodiments of how such semiconductor devices may look like are illustrated in co-pending patent application EP20205330.2, filed by the same applicant on 3 Nov. 2020, which document is incorporated herein by reference in its entirety.

In an embodiment, the shape of the resulting integrated magnetic flux concentrator is an overall cylindrical shape, or an overall conical shape, or an overall truncated conical shape, or a rotation symmetric shape, or a circular symmetric shape about said longitudinal axis, or has an overall prism shape with a regular polygonal cross-section, or has an overall mushroom shape, or comprises a mainly cylindrical portion, or comprises a mainly conical portion, or comprises a mainly truncated conical portion.

In an embodiment, the conical shape or truncated conical shape or conical portion or truncated conical portion is tapering towards the horizontal Hall element (Hc).

In an embodiment, a cross-section of the shape of the integrated magnetic flux concentrator in a plane parallel to the semiconductor substrate has a diameter (D) or a largest diagonal in the range from 15 to 40 µm, or from 15 to 35 µm, or from 16 to 34 µm, or from 17 to 33 µm, or from 18 to 32 µm, or from 19 to 31 µm, or from 20 to 30 µm.

In an embodiment, an orthogonal projection of the horizontal Hall element onto the substrate is located completely inside the periphery of an orthogonal projection of the bottom surface of the integrated magnetic flux concentrator onto said substrate.

In an embodiment, an orthogonal projection of the bottom surface of the integrated magnetic flux concentrator onto the substrate is located completely inside the periphery of an orthogonal projection of the horizontal Hall element onto said substrate.

In an embodiment, a periphery of an orthogonal projection of the horizontal Hall element onto the substrate intersects a periphery of an orthogonal projection of the bottom surface of the integrated magnetic flux concentrator onto said substrate.

In an embodiment, a distance between the horizontal Hall element and the integrated magnetic flux concentrator is value in the range from 1 to 20 µm.

In an embodiment, step a) comprises: providing a semiconductor substrate having a first plurality of integrated magnetic concentrator elements deposited by electroplating.

In an embodiment, the method may comprise a further step of depositing a sacrificial layer (e.g. a photoresist layer), and patterning this sacrificial layer so as to form a plurality of cavities which are aligned to only a subset of, or to at least a subset of, or to all of the electroplated IMC elements. The lateral dimensions of these cavities may be the same or may be different from those of the underlying electroplated IMC elements.

In an embodiment, the method may further comprise the step of sputtering a soft magnetic material (e.g. the same soft magnetic material, or another soft magnetic material) on top of the electroplated material, optionally preceded with a step of applying a stress-release layer (e.g. a polymer, polyimide, Al or AlN or Al2O3 or SiO2 or Ta2O5 or an Al-based or Si-based or Ta-based material) in between the electroplated layer and the sputtered layer.

In an embodiment, the method may further comprise the step of providing a stack of a plurality of alternating layers: one layer being a stress-release layer deposited by sputtering (e.g. Al or AlN or Al2O3 or SiO2 or Ta2O5 or an Al-based or Si-based or Ta-based material), the other layer being a soft magnetic material deposited by sputtering (e.g. Fe or Fe-based, Ni or Ni-based, Co or Co-based, FeNi or FeNi-based, metal-glass or mu-metal).

This may be particularly useful when forming two different kinds of integrated magnetic concentrators, for example a first kind of IMFC having e.g. a ring shape or a disc shape (e.g. of about 150-250 µm diameter, and about 20-25 µm thickness) which is located on top of the interconnection stack (as it is normally done in the prior art), and a second kind of IMFC having e.g. a pillar shape (e.g. a cylindrical or prism shape having a diameter of about 20-60 µm, and a thickness of about 27-60 µm), which extends partially into the interconnection stack, e.g. in a manner as described in more detail in co-pending patent application EP20205330.2 mentioned above, see e.g. FIG. 13(b) thereof). This second IMFC thus contacts one of the metal layers of the interconnection stack, acting as a seed layer. By making a lower portion of the second IMFC by electroplating, a good "foundation" and a good cohesion of this IMFC to the respective metal layer (of the "interconnection stack") is obtained, thereby reducing the risk of delamination when used in harsh environments. An upper portion of the second IMFC may be formed by sputtering, either as a single layer, or as a stack of multiple layers where layers of a soft-magnetic material (e.g. Fe, Ni, Co, etc.) are interleaved with stress-release layers (e.g. comprising Al or AlN or Al2O3 or SiO2 or Ta2O5 or an Al-based or Si-based or Ta-based material).

It is a further advantage that the upper portion of the second IMFC may have a (slightly) different shape and/or size than the lower portion of the second IMFC. For example, if both portions have a cylindrical shape, and if the upper portion has a slightly larger diameter than the lower portion, an overall mushroom-shape is formed, which may help to increase the magnetic gain Gz in the Z-direction (perpendicular to the semiconductor substrate).

In an embodiment, the method would comprise a first series of steps: a) providing a semiconductor substrate, b) making at least one first cavity, c) sputtering at least one layer of a soft magnetic material and d) removing at least a portion of soft magnetic material outside of the first cavity, and a second series of steps comprising: f) depositing a sacrificial layer, b) making a second cavity, c) sputtering at least one layer of a soft magnetic material, and d) removing at least a portion of the soft magnetic material outside of the second cavity.

It is an advantage of this embodiment that a bottom portion of some or all IMFC elements can be formed by the first series of steps, and an upper portion of some or all IMFC elements can be formed by the second series of steps, optionally with different dimensions and/or with different material(s).

According to a second aspect, the present invention also provides an integrated semiconductor substrate (e.g. a semiconductor wafer or a semiconductor die) comprising an integrated magnetic flux concentrator comprising one or more layers of one or more materials, and further comprising one or more of the following features:

i) an interconnection stack comprising at least three or at least four metal layers, and wherein the integrated magnetic flux concentrator extends at least partially into the interconnection stack;

ii) an interconnection stack comprising at least three or at least four metal layers, and wherein the integrated magnetic flux concentrator extends to one of the metal layers of the interconnection stack;

iii) at least one stress-release layer directly below said layer of soft magnetic material, and at least one stress-release layer directly on top of said layer of soft magnetic material;

iv) a plurality of two alternating layers comprising: a first layer comprising a stress-release material (e.g. Al or AlN or Al2O3 or SiO2 or Ta2O5 or an Al-based or Si-based or Ta-based material) and a second layer comprising a soft magnetic material (e.g. Fe or an Fe alloy, Ni or a Ni alloy, FeNi or an FeNi alloy, Co or a Co-alloy, or metal-glass, or mu-metal, etc.);

v) wherein the integrated magnetic flux concentrator has inclined sidewalls (i.e. forming an angle different from 90° with respect to the semiconductor substrate);

vi) wherein the integrated semiconductor substrate further comprises at least one horizontal Hall element, and wherein the integrated magnetic flux concentrator has a shape with an outer edge which is substantially aligned with the at least one horizontal Hall element;

vii) wherein the integrated semiconductor substrate further comprises at least one horizontal Hall element, and wherein the integrated magnetic flux concentrator has a shape with a geometric center which is substantially aligned with a geometric centre of the horizontal Hall element;

viii) wherein the integrated semiconductor substrate comprises a polished upper surface, or a polished surface with a passivation layer on top.

According to a third aspect, the present invention also provides an integrated semiconductor device comprising an integrated semiconductor substrate according to the second aspect, and a housing.

In an embodiment, the integrated semiconductor device may be a magnetic sensor device, a current sensor device, a proximity sensor device, a linear position sensor device, an angular position sensor device.

In an embodiment, the integrated semiconductor device may be an integrated transformer device (also known as micro-transformer device), further comprising at least one integrated coil, or at least two integrated coils, e.g. a transmitter coil and a receiver coil which may be inductively coupled to each other. An orthogonal projection of the receiver coil on the semiconductor substrate may be located inside an orthogonal projection of the transmitter coil (or vice versa), and an orthogonal projection of the integrated magnetic flux concentrator may be located inside the orthogonal projection of the inner coil.

In an embodiment, the integrated semiconductor device may further comprise a lead frame.

In an embodiment, the integrated semiconductor device may further comprise a mould compound.

According to another aspect, the present invention also relates to a current sensor system comprising a current sensor device according to the third aspect, and an electrical current conductor (e.g. a busbar).

According to another aspect, the present invention also relates to a proximity sensor system comprising a proximity sensor device according to the third aspect, and a metal target, movably arranged with respect to the proximity sensor device.

According to another aspect, the present invention also relates to a linear position sensor system comprising a linear position sensor device according to the third aspect, and a magnetic structure (e.g. a permanent magnet structure) comprising a plurality of alternating goals, wherein the sensor device is movable with respect to the magnetic structure or vice versa.

According to another aspect, the present invention also relates to an angular position sensor system comprising an angular position sensor device according to the third aspect, and a magnetic structure comprising a plurality of alternating goals, e.g. a multi-pole ring or disc magnet, which is rotatable with respect to the sensor device.

Particular and preferred aspects of the present invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1(a) shows a perspective view of a magnetic sensor structure or arrangement comprising a disc-shaped integrated magnetic flux concentrator (IMFC) and two horizontal Hall elements located on opposite sides of the disc, near a periphery thereof, as may be produced by a method according to the present invention.

FIG. 1(b) shows the sensor structure of FIG. 1(a) in cross-sectional side view.

FIG. 2 shows a perspective view of a variant of the magnetic sensor structure of FIG. 1(a), comprising a disc-shaped integrated magnetic flux concentrator (IMFC) and four horizontal Hall elements, angularly spaced apart by multiples of 90°, located near a periphery thereof, as may be produced by a method according to the present invention.

FIG. 10(a) to FIG. 14(d) shows intermediate semiconductor substrates, as can be obtained by performing some or all of the steps of the method of FIG. 9. More specifically, FIG. 10(a) to FIG. 10(d) illustrate semiconductor substrates comprising IMFC structures obtained by making a cavity, sputtering a magnetic material, and mechanical polishing (CMP) or etching.

FIG. 11(a) to FIG. 11(d) illustrate semiconductor substrates comprising IMFC structures obtained by making a cavity, depositing a stress release material, sputtering a magnetic material, and mechanical polishing (CMP) or etching.

FIG. 12(a) to FIG. 12(d) illustrate semiconductor substrates comprising IMFC structures obtained by making a cavity with inclined sidewalls, depositing a stress release material, sputtering a magnetic material, and mechanical polishing (CMP) or etching.

FIG. 13(a) to FIG. 13(d) illustrate semiconductor substrates comprising IMFC structures obtained by making a cavity partially extending into the interconnection stack, and by sputtering a plurality of layers, alternatingly comprising a stress release material, and a magnetic material, and by mechanical polishing (CMP) or etching.

FIG. 14(a) to FIG. 14(d) illustrate semiconductor substrates comprising IMFC structures obtained by depositing a sacrificial layer, making a cavity, sputtering a magnetic material, and lift-off of the sacrificial layer.

Figure 3A:
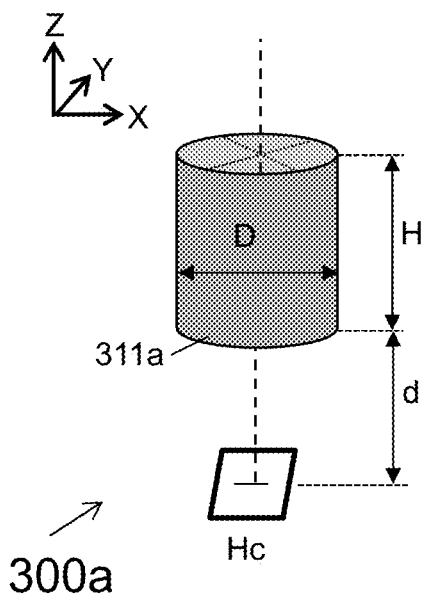
FIG. 3(a) to FIG. 3(d) show examples of magnetic sensor structures comprising an integrated magnetic flux concentrator having a central axis which is aligned to a center of a horizontal Hall element, as may be produced by a method according to the present invention.
Figure 3B:
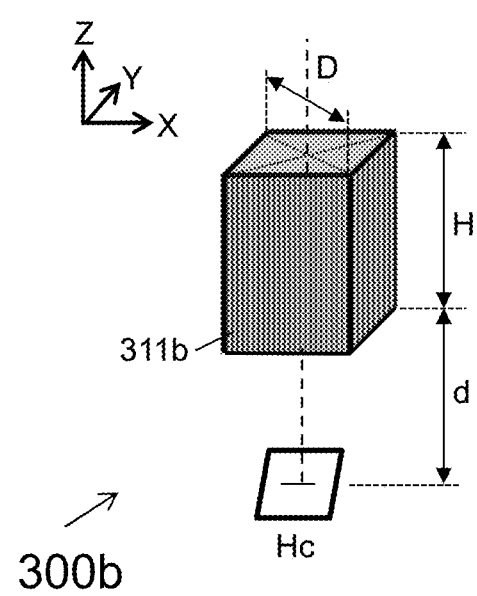
Figure 3C:
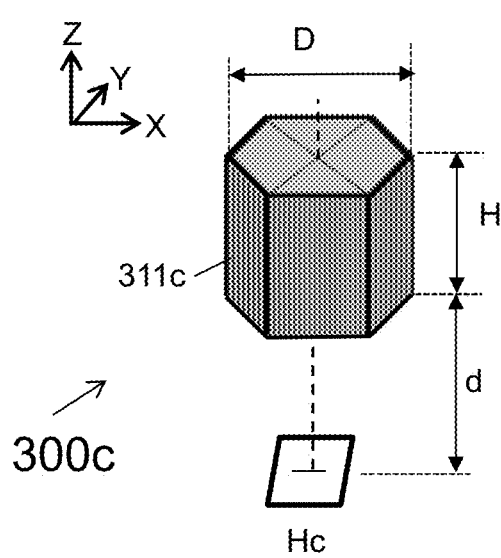
Figure 3D:
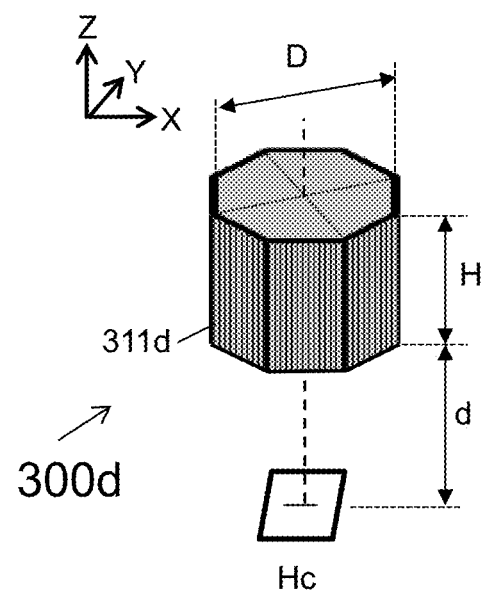

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but they may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where possible, the same or similar reference numerals (modulo 100) are used to indicate same or similar structural features in different embodiments.

In this document, the terms "integrated magnetic concentrator" (IMC), and "integrated magnetic flux concentrator" (IMFC) mean the same. In the context of the present invention these terms mainly refer to structures comprising a soft magnetic material deposited on a semiconductor substrate by electroplating and/or by sputtering.

In this document, the expression "located vertically above" or "vertical direction" or "orthogonal projection" or "Z-direction" refer to a direction perpendicular to the semiconductor substrate (e.g. silicon wafer), unless explicitly mentioned otherwise or clear from the context otherwise.

In this document, the "magnetic field component Bz" typically refers to a magnetic field component oriented in a direction perpendicular to the semiconductor substrate, and the "magnetic field component Bx and By" typically refer to magnetic field components oriented in a direction parallel to the semiconductor substrate, unless explicitly mentioned otherwise or clear from the context otherwise.

The present invention relates to the field of semiconductor substrates (e.g. semiconductor wafers or semiconductor dies) comprising at least one Integrated Magnetic Flux Concentrator (abbreviated as IMFC or IMC) and preferably further comprising at least one or at least two horizontal Hall elements, and to semiconductor devices (e.g. packaged semiconductor devices comprising one or more such semiconductor dies), and to methods of producing such semiconductor substrates (e.g. wafers, dies) and such semiconductor devices.

FIG. 1(a) shows a perspective view of a magnetic sensor structure 100 or sensor arrangement comprising a disc-shaped integrated magnetic flux concentrator 111 and two horizontal Hall elements H1, H2 located on opposite sides of the disc, near a periphery thereof. As is known in the art, this sensor structure is capable of measuring a magnetic field component Bx oriented along the X-axis, and a magnetic field component Bz oriented along the Z-axis. The signal Bx can be calculated for example using the formula: $Bx=A*(S2-S1)$, wherein A is a predefined constant, Si is the signal obtained from the first Hall element H1, and S2 is the signal obtained from the second Hall element H2. The signal Bz can be calculated for example using the formula: $Bz=K*(S1+S2)$, wherein K is a predefined constant, S1 is the signal obtained from the first Hall element H1, and S2 is the signal obtained from the second Hall element H2.

A known method of making such a semiconductor substrate is the following:
 a) providing a semiconductor substrate comprising one or more horizontal Hall elements, and comprising an "interconnection stack" (also known as "metal stack") comprising four metal layers separated by insulating layers, and comprising a passivation layer on top of the interconnection stack;
 b) providing a seed layer on top of the passivation layer;
 c) depositing a soft magnetic material (e.g. Fe) on top of the seed layer by means of electroplating.

The thickness or total thickness of the IMC can be determined by selecting appropriate parameters of the electroplating step (including: current amplitude and duration). Advantages of electroplating are inter alia (i) that it is a relatively fast technique, and (ii) electroplating does not require very high temperature, which may be detrimental to the correct functioning of the underlying components, and (iii) the soft magnetic material is only deposited above the seed layer, hence no additional step four removing excess material is required.

This technique also provides several problems, however.

One such problem is that it requires quite some effort to find optimal process-parameters for the electroplating step, which moreover is highly dependent on the specific design or layout at hand, hence needs to be re-optimized for each new design or product.

Another problem the inventors encountered is that it is increasingly difficult to produce an integrated semiconductor substrate with IMC with a high yield, if the "IMC-coverage" is larger than about 2% to 3%.

Another problem which the inventors encountered is that the known technique does not readily allow to build two different kinds of IMC structures having different heights on top of the same semiconductor substrate.

In order to solve one or more of the above-mentioned problems, the present invention provides a method of producing a semiconductor substrate (e.g. a semiconductor wafer or a semiconductor die) comprising at least one integrated magnetic flux concentrator (IMFC), comprising the following steps:
 a) providing a semiconductor substrate having an upper surface (or a top layer);
 b) making at least one cavity in said upper surface (or said top layer);
 c) sputtering at least one layer of a soft magnetic material;
 d) removing substantially all of the soft magnetic material that is situated outside of the at least one cavity, while leaving at least a portion (preferably at least 50%, or at least 70%, or at least 80% or at least 90%, or at least 95%, or substantially all) of the soft magnetic material that is inside said at least one cavity.

Optionally, step d) comprises applying chemical and mechanical polishing (CMP) or Lift-off.

Optionally, step c) may comprise depositing one or more stress-release layers.

This combination of features is not trivial, inter alia because:

there is a common believe that sputtering would require a very long time, which would make the process prohibitively expensive, and which would not be an economically viable solution in a competitive market such as industrial or automotive applications;

since the IMFC is applied on top of the semiconductor substrate, i.e. after the semiconductor substrate is produced, and taking into account that sputtering is performed in vacuum at a high temperature, there is a serious risk that underlying electronics would be negatively impacted, especially in view of the long time required for sputtering as compared to electroplating (typically a factor of 10 larger), and even more so if the height of the IMFC-structures to be built would be larger than about 20 µm, typically used today, applying the soft magnetic material by sputtering is one thing, but since the deposition of the sputtered material is not limited to locations above a seed layer, the inventors had to come up with a way of "patterning" the sputtered material. They came to the idea of building cavities, then sputtering the material over the entire surface, and then applying CMP or Lift-off for removing the excess material. It is noted that CMP is normally used for planarization purposes. Likewise, Lift-off is not normally used for patterning-purposes;

and last but not least, even if it would be possible to deposit a relatively thick (e.g. Height ≥25 µm) IMC by sputtering, the resulting product has to be suitable for operating in an industrial or automotive environment, meaning inter alia that the reliability and life-time of the sensor device should not be negatively impacted, meaning e.g. that the IMC should not delaminate when used in a temperature range from −40° C. to +140° C.

It is an advantage of proposed method(s) without an electroplating step, that it requires less effort to find optimal process parameters, and does not require the formation of a seed layer, and that the "IMC coverage" can be higher than e.g. 5% or higher than e.g. 10%, or higher than 15%, or higher than 20%.

It was surprisingly found that the proposed method(s) can be used not only for building IMC structures such as the disc shape shown in FIGS. 1(a) and 1(b), having a typical height of about 20 µm and a typical diameter of about 200 µm, but also for building IMC structures having a height of at least 20 µm, or at least 25 µm, or at least 30 µm, or at least 40 µm, or at least 50 µm, or at least 60 µm.

It was surprisingly found that despite the relatively long time required for sputtering the soft magnetic material, especially when the height of the IMC structure to be build is at least 25 µm, or at least 30 µm, or at least 40 µm, that the electronic components (e.g. horizontal Hall element, biasing circuitry, operational amplifier, etc.) implemented in the semiconductor substrate underneath, are not (or not significantly) negatively impacted.

These are the main underlying ideas, and principles and advantages of embodiments of the present invention. Specific embodiments may offer further or other advantages, as described in more detail below.

Before describing methods of producing integrated semiconductor substrates comprising (an) integrated magnetic flux concentrator(s), some illustrative examples of envisioned IMFC structures will be shown in FIG. 1(a) to FIG. 8, the present invention not being limited thereto.

Figure 7:
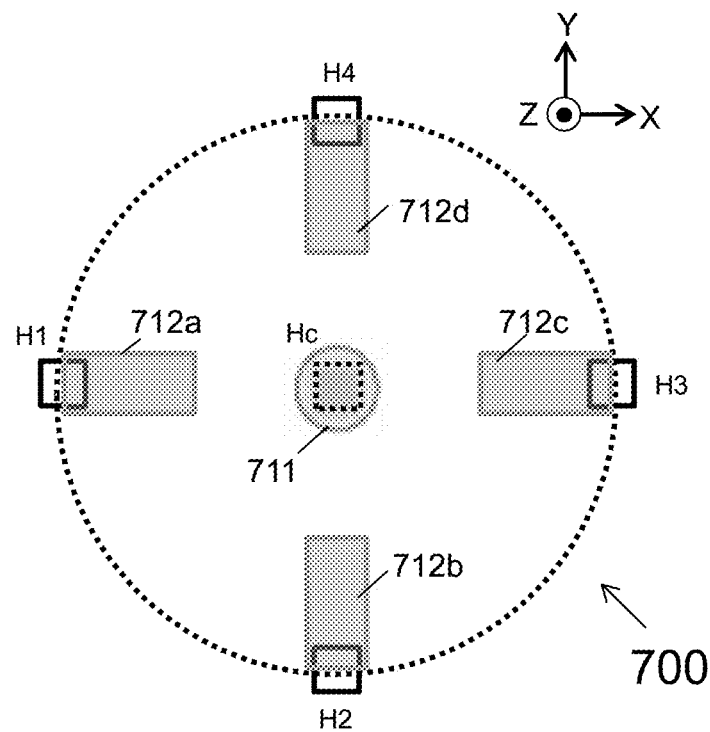
FIG. 7 shows a top view of a variant of the magnetic sensor structure of FIG. 6, also capable of measuring and passively amplifying three orthogonal magnetic field components Bx, By, Bz, as may be produced by a method according to the present invention.
Figure 8:
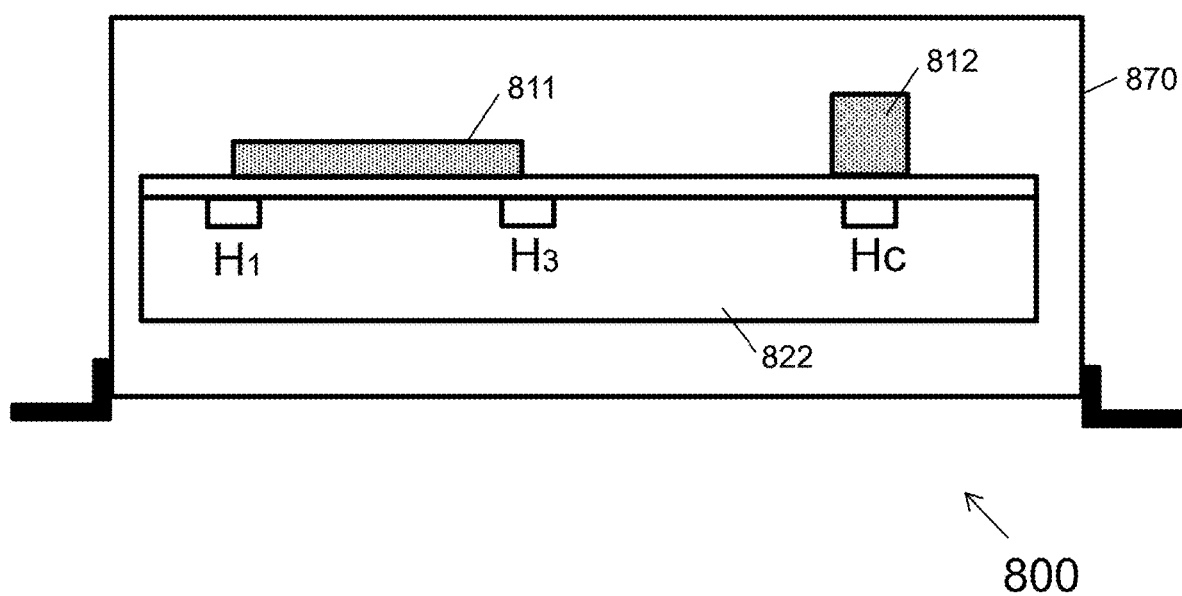
FIG. 8 is a schematic representation of an integrated semiconductor device comprising a semiconductor substrate comprising a first magnetic sensor structure (shown on the left of FIG. 8) comprising a first IMFC having a first shape and first height, and a second magnetic sensor structure (shown on the right of FIG. 8) comprising a second IMFC having a second shape and second height, which may be smaller than, substantially equal to, or larger than the first height, as may be produced by a method according to the present invention.
Figure 9:
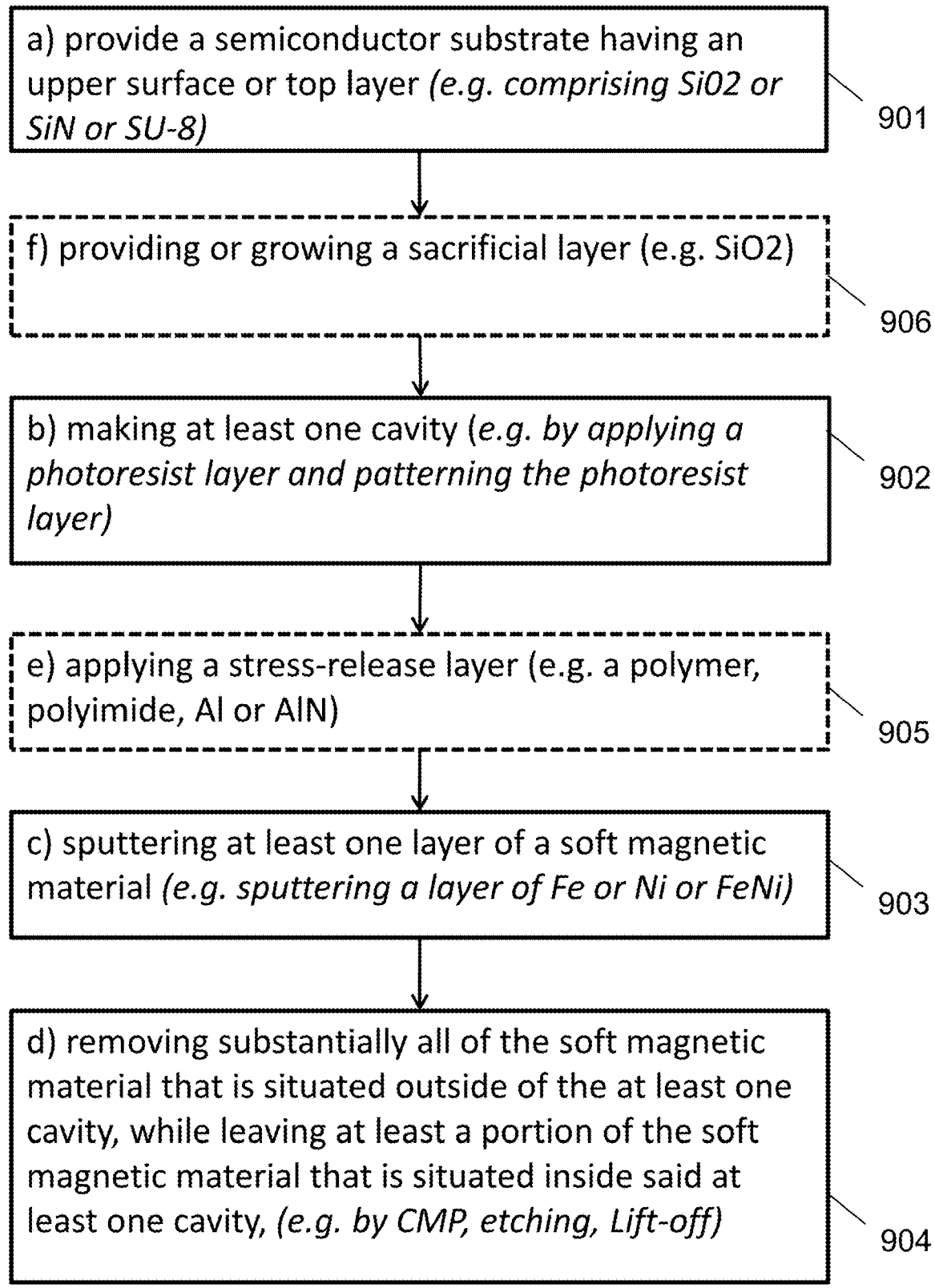
FIG. 9 shows a flowchart of a method of producing a semiconductor substrate with at least one integrated magnetic flux concentrator (IMFC), as proposed by the present invention.

FIG. 9 shows a flow-chart illustrating method(s) of producing an integrated semiconductor substrate with an IMFC, for example as illustrated in FIG. 1(a) to FIG. 8.

FIG. 10(a) to FIG. 14(d) show intermediate semiconductor substrates as may be obtained by performing a method shown in FIG. 9, or variants thereof.

Figure 15:
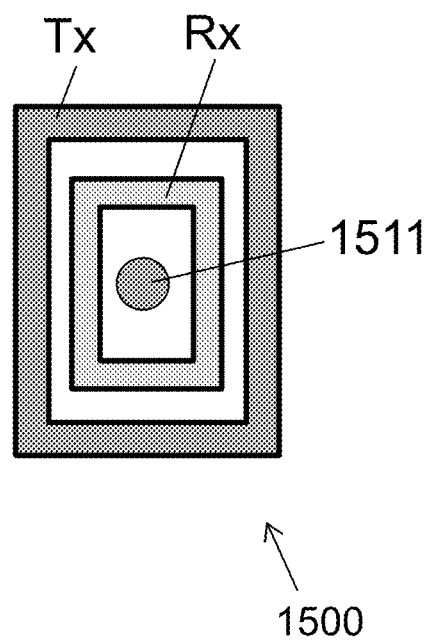
FIG. 15 shows a schematic representation of an integrated transformer, as can be produced by a method according to the present invention.

FIG. 15 shows a schematic representation of an integrated transformer, as another example of a device in which an integrated magnetic flux concentrator can be used.

Referring now to the Figures.

FIG. 1(a) is already discussed above and shows a magnetic sensor structure 100 comprising a semiconductor substrate (not explicitly shown) with two horizontal Hall elements H1, H2, and a disc shaped IMFC 111. The disc shaped IMFC 111 may be created in a classical manner using electroplating, or in accordance with a method proposed by the present invention.

Preferably, the height (or thickness) of the disc 111 is a value in the range from 2.0 µm to 50 µm, or from 5 µm to 40 µm, or from 10 µm to 30 µm, or from 15 µm to 25 µm, or from 20 µm to 25 µm; and preferably the diameter of the disc 111 is a value in the range from 100 µm to 250 µm, or from 150 µm to 250 µm, or from 200 µm to 250 µm.

FIG. 1(b) shows the sensor structure 100 of FIG. 1(a) in cross-sectional side view.

FIG. 2 shows a perspective view of a variant of the magnetic sensor structure of FIG. 1(a), comprising a disc-shaped integrated magnetic flux concentrator 211 and four horizontal Hall elements H1-H4, angularly spaced apart by multiples of 90°, located near a periphery of the disc shaped IMFC. This sensor structure is capable of measuring and passively amplifying a magnetic field component Bx oriented along the X-axis and is capable of measuring and passively amplifying a magnetic field component By oriented along the Y-direction, and is capable of measuring a magnetic field component Bz oriented along the Z-axis. The disc shaped IMFC 211 may be created in a classical manner, using electroplating, or in accordance with a method proposed by the present invention.

The same preferred dimensions as mentioned for the disc of FIGS. 1(a) and 1(b) are applicable.

FIG. 3(a) to FIG. 3(d) show examples of magnetic sensor structures 300a-300d, each comprising a respective integrated magnetic flux concentrator 311a-311d having a central axis which is aligned to a center of a horizontal Hall element Hc. These sensor structures are capable of measuring and passively amplifying a magnetic field component Bz oriented in the Z-direction. These IMFC-structures may be created in a classical manner, using electroplating, or in accordance with a method proposed by the present invention. It is noted that more details about the sensor structures or devices shown in FIG. 3(a) to FIG. 8, can be found in co-pending patent application EP20205330.2, filed by the same applicant on 3 Nov. 2020, incorporated herein by reference in its entirety.

Preferably, the height of the IMFC 311a-311d (in the Z-direction) is a value in the range from 2.0 µm to 80 µm, or from 5 µm to 60 µm, or from 10 µm to 50 µm, or from 20 µm to 50 µm, or from 30 µm to 80 µm, e.g. equal to about 25 µm, or equal to about 30 µm, or equal to about 35 µm, or equal to about 40 µm, or equal to about 45 µm; and preferably the largest transversal dimension (e.g. the diameter in case of a cylindrical shape, or the average diameter in case of a frustoconical shape, or the largest diagonal in case of a prism-shape) is a value in the range from 2.0 µm to 80 µm, or from 5 µm to 60 µm, or from 10 µm to 50 µm, or from 20 µm to 50 µm, e.g. equal to about 25 µm, or equal to about 30 µm, or equal to about 35 µm, or equal to about 40 µm, or equal to about 45 µm.

In certain embodiments, a ratio (H/D) of the height (H) and said largest transversal dimension (D) is at least 25%, or at least 30% or at least 40%, or at least 50%, or at least 60%, or at least 75%, or at least 90%, or at least 100%, or at least 110%. This ensures a good magnetic gain Gz.

Figure 4A:
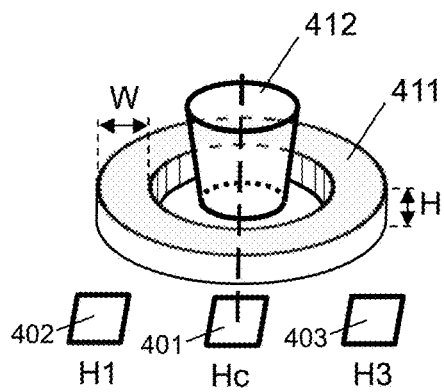
FIG. 4(a) shows an example of a magnetic sensor structure comprising: a first magnetic flux concentrator in the form of a ring, and two horizontal Hall elements arranged near a periphery of the ring; and a second magnetic flux concentrator in the form of a cylinder or a frustoconical shape having a central axis which is aligned to a centre of a third horizontal Hall element, as may be produced by a method according to the present invention.

FIG. 4(a) shows an example of a magnetic sensor structure 400 (or sensor arrangement) comprising: a first magnetic flux concentrator 411 in the form of a ring, and two horizontal Hall elements H1, H3 arranged near a periphery of the ring 411; and a second magnetic flux concentrator 412 in the form of a cylinder or a prism or a frustoconical shape having a central axis which is aligned to a centre of a third horizontal Hall element Hc, as may be produced by a method according to the present invention.

The sensor structure 400 is capable of measuring and passively amplifying a magnetic field component Bx oriented in the X-direction, and of measuring and passively amplifying a magnetic field component Bz oriented in the Z-direction. The height of the ring 411 may be substantially equal to, or smaller than, or higher than the height of the frustoconical shape 412. The ring 411 may have a height in the range from about 20 µm to about 30 µm (e.g. equal to about 25 µm), and an outer diameter in the range from about 150 µm to about 250 µm (e.g. equal to about 220 µm). The height of the cylindrical or frustoconical or prism shaped IMFC 412 may be a value in the range from about 30 µm to about 60 µm, and the diameter (or average diameter or largest diagonal) may be a value in the range from about 20 µm to about 40 µm (e.g. equal to about 30 µm).

As will become clear further, in embodiments wherein both IMFC structures 411, 412 have the same height, they may both be formed at the same time, e.g. both by electroplating, or both by sputtering. In another embodiment, the ring shaped IMFC 411 is formed by electroplating, and the IMFC 412 is formed by sputtering. In another embodiment, the ring shaped IMFC 411 is formed by sputtering, and the IMFC 412 is formed by electroplating. In yet another embodiment, the ring shaped IMFC 411 and a lower portion of the IMFC 412 are both formed by electroplating, and an upper portion of the IMFC 412 is formed by sputtering.

It is an advantage of embodiments wherein the height of the ring-shaped IMC 411 and the height of the central IMC 412 are the same, in that all IMC structures can be formed at the same time.

Preferably, the height H of the ring 411 is a value in the range from 2 µm to 50 µm, or from 5 µm to 40 µm, or from 10 µm to 30 µm, or from 15 µm to 25 µm, or from 20 µm to 25 µm, e.g. equal to about 20 µm; and preferably the outer diameter of the ring 411 is a value in the range from 100 µm to 250 µm, or from 150 µm to 250 µm, or from 200 µm to 250 µm, e.g. equal to about 200 µm; and preferably the width W of the ring 411 is a value in the range from 2 µm to 50 µm, or from 5 µm to 40 µm, or from 10 µm to 30 µm, or from 15 µm to 25 µm, or from 20 µm to 25 µm. The width W may be equal to or larger than the height H.

Preferred dimensions of the central element 412 are the same as those mentioned in FIGS. 3(a) to 3(d).

Figure 4B:
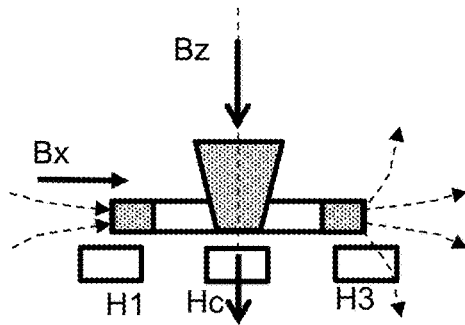
FIG. 4(b) is a cross-sectional side view of the sensor structure of FIG. 4(a).

FIG. 4(b) is a cross-sectional side view of the sensor structure 400 of FIG. 4(a).

Figure 5:
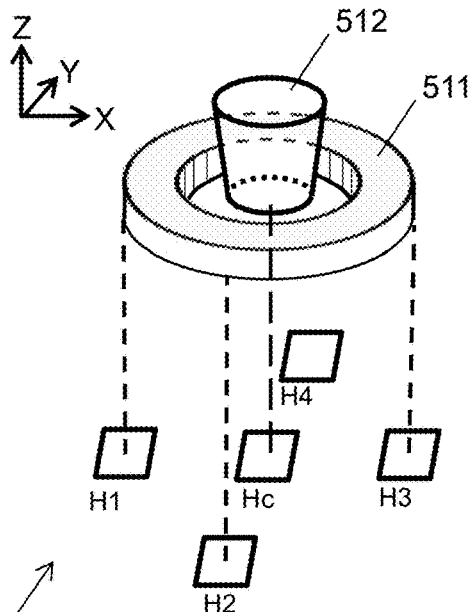
FIG. 5 shows a perspective view of a variant of the magnetic sensor structure of FIG. 4(a), comprising a ring-shaped integrated magnetic flux concentrator (IMFC) and four horizontal Hall elements located near a periphery of the ring, angularly spaced apart by multiples of 90°; and a second magnetic flux concentrator in the form of a cylinder or a frustoconical shape having a central axis which is aligned to a centre of a third horizontal Hall element, as may be produced by a method according to the present invention.

FIG. 5 shows a perspective view of a variant 500 of the magnetic sensor structure of FIG. 4(a), comprising a ring-shaped integrated magnetic flux concentrator 511 and four horizontal Hall elements H1-H4 angularly spaced apart by multiples of 90°, located near a periphery of the ring 511; and a second magnetic flux concentrator 512 in the form of a cylinder or a prism or a frustoconical shape having a central axis which is aligned to a centre of a fifth horizontal Hall element Hc, as may be produced by a method according to the present invention.

The sensor structure 500 is capable of measuring and passively amplifying a magnetic field component Bx oriented along the X-axis, and of measuring and passively amplifying a magnetic field component By oriented along the Y-direction, and of measuring and passively amplifying a magnetic field component Bz oriented along the Z-axis. The height of the ring 511 may be substantially equal to, or smaller than, or larger than the height of the central IMFC 512.

Similar as mentioned in FIGS. 4(a) and 4(b), the first and second IMFC 511, 512 may both be formed by electroplating; or may both be formed by sputtering; or one may be formed by electroplating and the other by sputtering; or the ring 511 and a lower portion of the second IMFC 512 may be formed by electroplating, and thereafter an upper portion of the second IMFC 512 may be formed by sputtering on top of the lower portion.

Preferred dimensions of the central element 512 are the same as those mentioned in FIGS. 3(a) to 3(d), and preferred dimensions of the ring 511 are the same as those mentioned in FIGS. 4(a) and 4(b).

Figure 6:
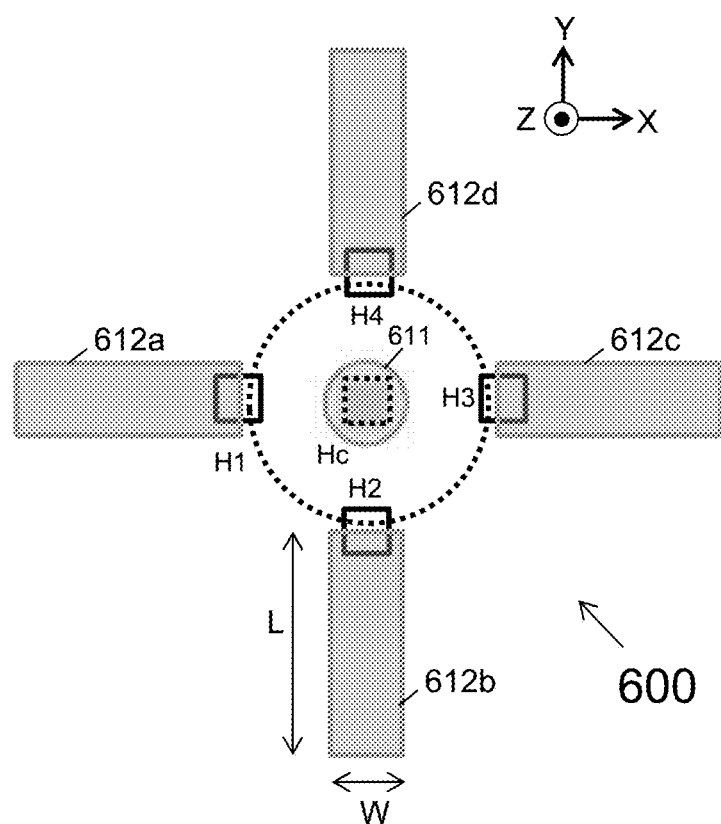
FIG. 6 shows a top view of another magnetic sensor structure capable of measuring and passively amplifying three orthogonal magnetic field components Bx, By, Bz, as may be produced by a method according to the present invention.

FIG. 6 shows a top view of another magnetic sensor structure 600 capable of measuring and passively amplifying three orthogonal magnetic field components Bx, By, Bz, as may be produced by a method according to the present invention.

This structure 600 comprises a central horizontal Hall element Hc and a first (e.g. cylindrical or frustoconical or prism-shaped) IMFC 611 located above the central horizontal Hall element Hc and aligned thereto, and further comprises four horizontal Hall elements H1-H4 and four elongated IMFC elements 612a-612d, oriented radially outwards with respect to the four horizontal Hall elements, forming a so called "sun shape".

Similar as mentioned in FIGS. 4(a) and 4(b), the first IMFC 611 and the second IMFC elements 612a-612d may all be formed by electroplating; or they may all be formed by sputtering; or the central IMFC 611 may be formed by electroplating and the elongated IMFC elements 612a-612d may be formed by sputtering; or the elongated elements 612a-612d and a lower portion of the central IMFC 611 may be formed by electroplating, and thereafter an upper portion of the central IMFC 611 may be formed by sputtering on top of the lower portion.

Preferably, the height (or thickness) of the elongated elements 612a-612d is a value in the range from 2 µm to 50 µm, or from 5 µm to 40 µm, or from 10 µm to 30 µm, or from 15 µm to 25 µm, or from 20 µm to 25 µm; and the width W of the elongated elements 612a-612d is a value in the range from 2 µm to 50 µm, or from 5 µm to 40 µm, or from 10 µm to 30 µm, or from 15 µm to 25 µm, or from 20 µm to 25 µm; and the length L of the elongated elements 612a-612d is a value from 40 µm to 250 µm. Preferably the width W of the elongated elements 612a-612d is equal to or larger than the height of the elongated elements.

Preferred dimensions of the central element 611 are the same as those mentioned in FIGS. 3(a) to 3(d).

The height of the elongated IMFC elements 612a-612d may be smaller than, substantially equal to, or larger than a height of the central IMFC 611.

It is an advantage of embodiments wherein the height of the central IMC 611 and the height of the elongated IMC elements 612a-612d is the same, in that all IMC structures may be formed at the same time.

FIG. 7 shows a top view of a magnetic structure 700 which is a variant of the magnetic sensor structure 600 of FIG. 6, also capable of measuring and passively amplifying three orthogonal magnetic field components Bx, By, Bz, as may be produced by a method according to the present invention.

This structure comprises a central horizontal Hall element Hc and a first (e.g. cylindrical or frustoconical or prism-shaped) IMFC 711 located above the central horizontal Hall element Hc and aligned thereto, and further comprises four horizontal Hall elements H1-H4 and four elongated IMFC elements 712a-712d, oriented radially inwards with respect to the four horizontal Hall elements H1-H4.

The central IMFC 711 and the elongated IMFC elements 712a-712d may be produced in the same way as those of FIG. 6.

The central IMFC 711 and the elongated IMFC elements 712a-712d may have the same dimensions as those mentioned in FIG. 6.

FIG. 8 is a schematic representation of an integrated semiconductor device 800 comprising a semiconductor substrate 822 embedded in a housing 870. The housing may further comprise a lead frame (not shown) with elongated leads, having outer portions extending from the housing (known as "pins").

The semiconductor substrate 822 comprises a first magnetic sensor structure (shown on the left of FIG. 8) comprising a first IMFC 811 having a first shape and first height, and further comprising a second magnetic sensor structure (shown on the right of FIG. 8) comprising a second IMFC 812 having a second shape and second height, which may be smaller than, substantially equal to, or larger than the first height. The first IMFC 811 may have a disc or ring shape or another shape. The second IMFC 812 may have a cylindrical, frustoconical or prism-shape or another shape.

The main purpose of FIG. 8 is to show an example of a semiconductor device 800 with a semiconductor substrate 822 comprising different IMFC structures next to each other, in contrast with the examples shown in FIG. 4(a) to FIG. 5, where the central IMFC is located inside the ring shaped IMFC, or in contrast with the examples of FIG. 6 and FIG. 7, where the central IMFC is located at a center of the elongated IMFC elements.

Most of what has been said above is also true here, mutatis mutandis. For example, both IMFC structures 811, 812 may be produced by electroplating; or both IMFC structures 811, 812 may be produced by sputtering; or one of them may be produced by electroplating and the other by sputtering; or the first IMFC 811 and a lower portion of the second IMFC 812 may be produced by electroplating, and an upper part of the second IMFC 812 may be produced by sputtering.

FIG. 1(a) to FIG. 8 illustrate several examples of IMFC structures that may be produced by prior art methods, or by methods according to the present invention, which will be described next. It is noted however that the present invention is not limited to the production of these illustrative structures, but also applies to other structures produced in accordance with the methods described further.

FIG. 9 shows a flowchart of a method 900 of producing a semiconductor substrate with at least one integrated magnetic flux concentrator (IMFC), as proposed by the present invention. The method 900 comprises at least the following steps:

a) providing 901 a semiconductor substrate having an upper surface or a top layer. This upper surface or top layer may e.g. comprise SiO2 or SiN or SU-8.

b) making 902 at least one cavity in the upper surface.

c) sputtering 903 at least one layer of a soft magnetic material. The soft magnetic material may comprise for example one or more of: Fe, Ni, FeNi, an Fe-based alloy, a Ni-based alloy, an FeNi-based alloy, a Co-based alloy, metal-glass, a mu-metal, etc.

d) removing 904 substantially all of the soft magnetic material that is situated outside of the at least one cavity, while leaving at least a portion of the soft magnetic material that is situated inside said at least one cavity.

The method may further comprise step f) of providing or growing 906 a sacrificial layer, e.g. a SiO2 layer, or a photoresist layer.

The method may further comprise step e) of applying 905 a stress-release layer, e.g. a polymer, e.g. polyimide, Al or AlN or Al2O3 or SiO2 or Ta2O5 or an Al-based or Si-based or Ta-based material, see also FIG. 11(c) and FIG. 12(c).

Step d) may comprise: applying chemical and mechanical polishing (CMP).

Figure 14A:
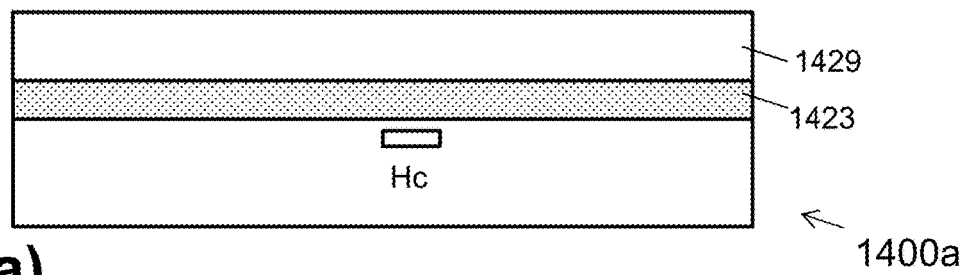
Figure 14B:
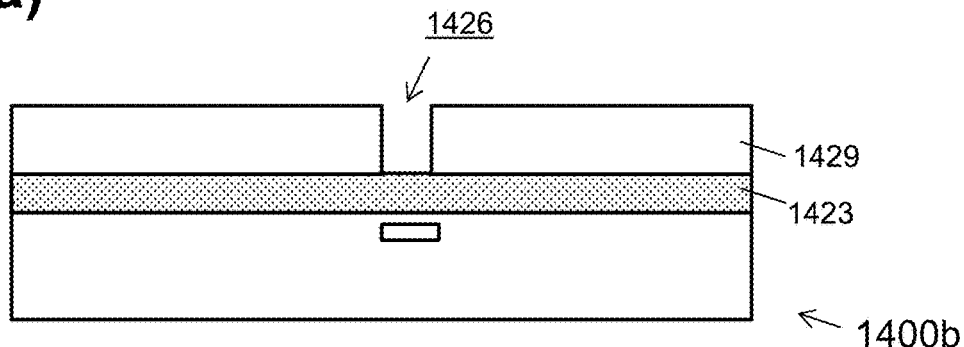
Figure 14C:
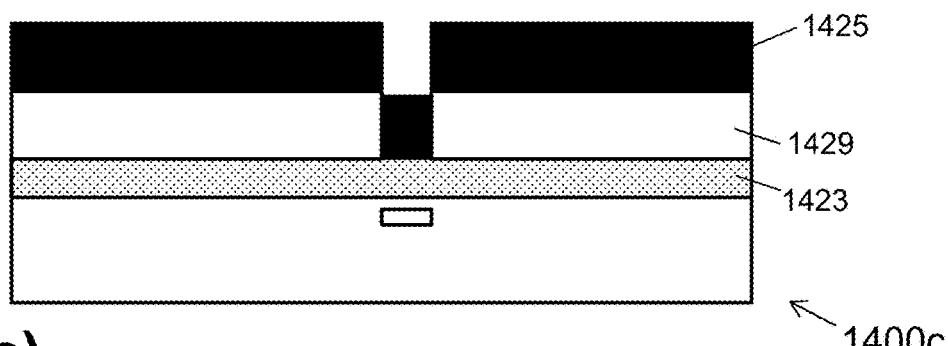
Figure 14D:
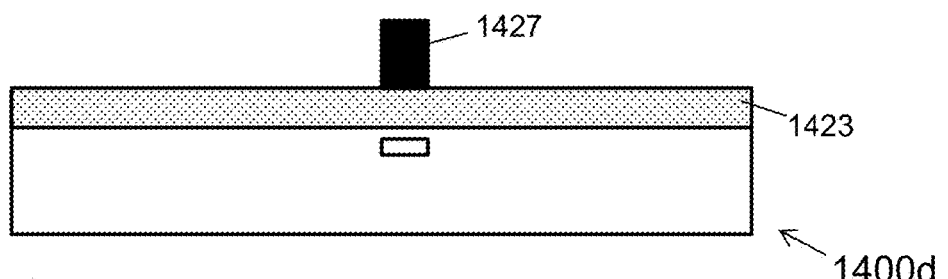

Step d) may comprise: applying a lift-off technique, see also FIG. 14(d).

Step b) may comprise: applying 902 a photoresist layer and patterning the photoresist layer using lithography.

FIG. 10(a) to FIG. 14(d) show intermediate semiconductor structures, as can be obtained by performing some or all of the steps of the method of FIG. 9. While the present invention is not limited to the specific examples shown in FIG. 10(a) to FIG. 14(d) and the method steps used to build these structures, these examples will illustrate various method-steps and their effect.

Figure 10A:
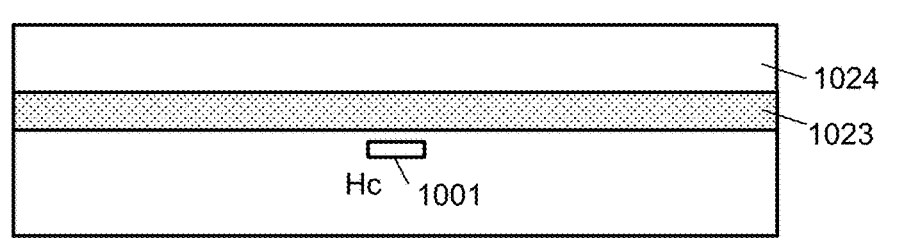

FIG. 10(a) show a semiconductor substrate 1000a, e.g. a semiconductor wafer or a semiconductor die. The substrate 1000a shown in FIG. 10(a) preferably has an active surface comprising at least one horizontal Hall element 1001; and an interconnection stack 1023 (also known as "metal stack") on top of the active surface. The interconnection stack preferably comprises at least 4 metal layers M1 to M4 (not explicitly shown), M1 being the metal layer closest to the horizontal Hall element. The substrate 1000a further comprises a top layer 1024, e.g. a passivation layer, or SiO2 or SiN or a photoresist layer, e.g. SU-8. The substrate 1000a may be a CMOS wafer. Of course, in practice the semiconductor substrate may be much more complex than the simple example shown here and may comprise more than one horizontal Hall element.

Figure 10B:
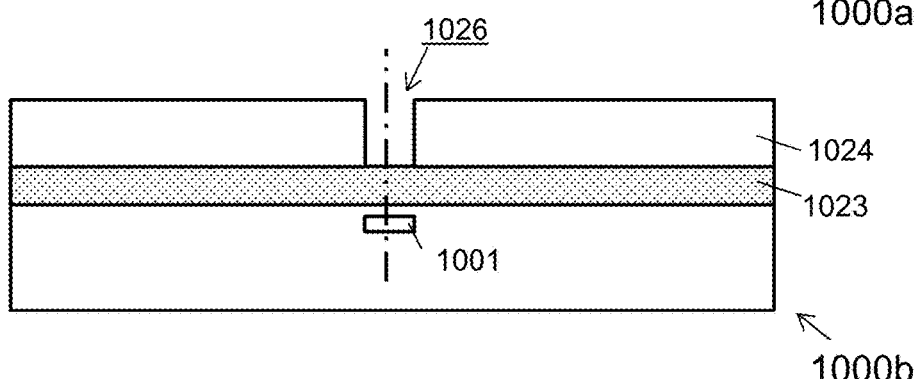

FIG. 10(b) shows the semiconductor substrate 1000a of FIG. 10(a) after providing a cavity 1026 in the upper surface. The cavity may for example be formed by etching. In the example shown, the central axis of the cavity is aligned with the centre of the horizontal Hall element 1001, as would be the case for example when making an IMFC as shown in FIG. 3(a) to FIG. 3(d), or when making the central IMFC as shown in FIG. 4(a) to FIG. 7, but that is not absolutely required. Indeed, when building an IMFC-structure as shown in FIG. 1(a) or FIG. 2, an outer periphery of the cavity 1026 would be located above or near the horizontal Hall element.

In the example shown in FIG. 10(b), the cavity 1026 extends to the top of the interconnection stack 1023 (also referred to as "metal stack"), but that is not absolutely required. In fact, in some embodiments, the cavity 1026 may partially extend into the interconnection stack. This aspect is not shown in FIG. 10(b) but is explained in more detail in patent application EP19176438.0, filed by the same applicant on 24 May 2019, incorporated herein by reference in its entirety, (see in particular FIGS. 3(a) to 3(d) and FIG. 5 and FIG. 7 thereof, and the corresponding description), as well as in patent application EP20205330.2 filed by the same applicant on 3 Nov. 2020, which is also incorporated herein by reference in its entirety (see in particular FIG. 13(a) to FIG. 13(d) thereof and the corresponding description). In order to understand the present invention, it suffices to know that the cavity would typically extend to one of the metal layers, which acts as an etch stop.

Figure 10C:
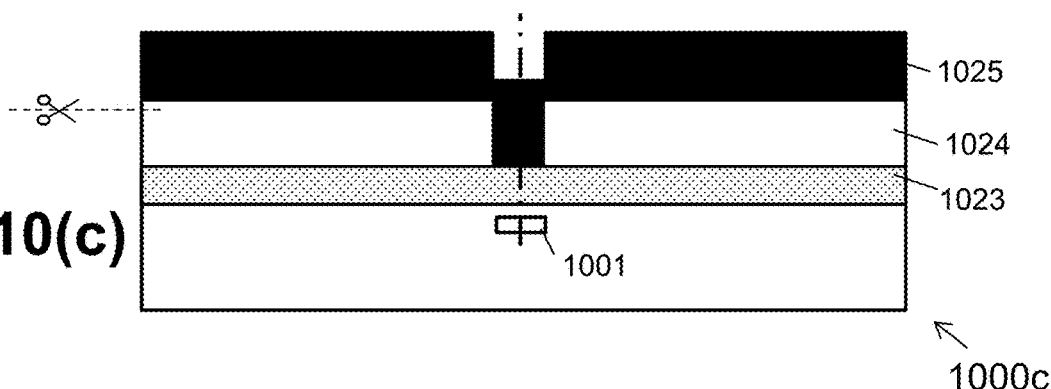

FIG. 10(c) shows the semiconductor substrate 1000b of FIG. 10(b) after depositing one or more layers of one or more materials, including sputtering at least one layer of a soft magnetic material. In the specific example of FIG. 10(c), a single layer of a soft magnetic material is sputtered, but the present invention is not limited hereto (see e.g. FIG. 11(c) or FIG. 13(c)).

Depending on the height (or thickness) of the one or more deposited layer or layers, and the depth of the penetration into the interconnection stack (if applied), the top of the material deposited in the cavity will extend below or above a top of the layer 1024. The height of the deposited layers can be determined by controlling sputtering parameters, including the duration of the sputtering, in manners known per se in the art. In some embodiments, the top of the one or more deposited layer or layers is situated lower than, substantially level with, or higher than the top of the layer 1024. In the specific example of FIG. 10(c) the cavity does not penetrate into the interconnection stack, and the height of the deposited layer is larger than the height of the layer 1024, hence, the top of the deposited material inside the cavity 1026 is situated above the top of the layer 1024.

Figure 10D:
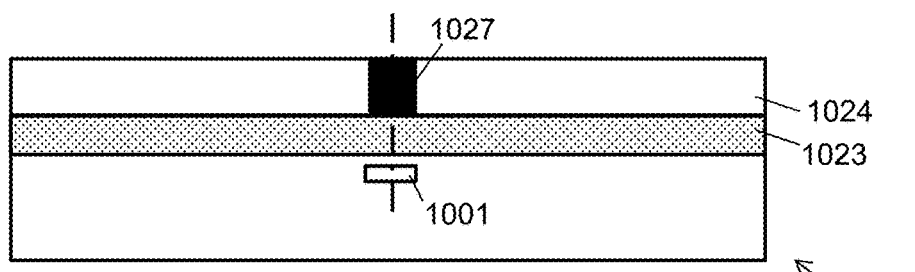

FIG. 10(d) shows the semiconductor substrate 1000c of FIG. 10(c) after removing all, or at least a major portion of the soft magnetic material situated outside of the cavity 1026. This removal can be done by means of chemical and mechanical polishing (CMP), as schematically indicated by a scissors symbol. The result is a semiconductor substrate 1000d with an integrated magnetic flux concentrator 1027.

It is an advantage of embodiments wherein the polishing does not physically contact the soft magnetic material (e.g. if the top of the deposited layers inside the cavity would be lower than the top of the layer 1024), because this may provide improved magnetic properties.

It is an advantage of embodiments wherein the polishing does physically contact the soft magnetic material (e.g. if the top of the deposited layers inside the cavity would be higher than the top of the layer 1024), because this provides an IMFC with a flat upper surface.

Optionally, the layer 1024 may also be removed or partially removed. This will typically be the case if a sacrificial layer (e.g. a photoresist layer) was applied on top of the semiconductor substrate 1000a of FIG. 10(a). It is an advantage of not removing this layer 1024 that the IMFC 1027 is mechanically supported on its sides, thus reducing the risk of the IMFC 1027 being detached from the semiconductor substrate over time. It is an advantage of removing this layer 1024 that the IMFC 1027 does not experience mechanical stress from the sidewalls, which may be beneficial for its magnetic properties (e.g. saturation, hysteresis, etc.)

Optionally, a (further) protection layer may be applied over the entire substrate (not shown), for example a SiN layer.

Optionally, a stress-release layer (not shown), e.g. a continuous stress-release layer, e.g. a polymer layer, e.g. polyimide layer may be present between the interconnection stack 1023 and the layer 1024.

In summary, FIG. 10(d) thus illustrates a semiconductor substrate 1000d (e.g. a semiconductor wafer or a semiconductor die) comprising an IMFC structure 1027 as can be obtained by b) making a cavity; and by c) sputtering a magnetic material; and by d) applying chemical and mechanical polishing (CMP).

While not explicitly shown, the skilled reader having the benefit of the present disclosure will know that a semiconductor wafer can be cut in a plurality of semiconductor dies, that these dies can be mounted on a lead frame and overmoulded in known manners, to form packaged devices. Depending on the functionality implemented on the semiconductor substrate, the packaged device may for example be a sensor device, a current sensor device, a linear position sensor device, an angular position sensor device, a proximity sensor device, a proximity switch, a micro-transformer, etc., all of which are envisioned by the present invention.

FIG. 11(a) to FIG. 11(d) show a variant of FIG. 10(a) to FIG. 10(d), and show intermediate semiconductor substrates 1100a to 1100d associated with another method according to an embodiment of the present invention, which is a variant of FIG. 9.

The main difference between the semiconductor substrates of FIG. 11(a)-(d) and FIG. 10(a)-(d) is that also a stress release layer is deposited. More specifically, FIG. 11(a) and FIG. 11(b) are identical to FIG. 10(a) and FIG. 10(b).

FIG. 11(c) shows a semiconductor substrate 1100c obtained after depositing one or more layers of one or more materials on the semiconductor substrate 1100b of FIG. 10(b), wherein the first (lower) layer is a stress-release layer 1130, and at least one of the other layers is a soft magnetic material deposited by sputtering.

The stress-release layer 1130 may be or may comprise a polymer layer or a polyimide layer, which may be deposited e.g. by spin-coating. The stress-release layer may be or may comprise Al or an Al-alloy, which may be deposited e.g. by electroplating or by sputtering. The stress release layer may be or may comprise AlN or Al2O3 or SiO2 or Ta2O5 or an Al-based or Si-based or Ta-based material which may be deposited for example by sputtering.

The stress-release layer 1130 may have a thickness in the range from about 0.5 nm to about 100 nm, or from about 0.5 nm to about 40 nm, or from about 1.0 nm to about 40 nm, or from about 1.0 nm to about 20 nm, or from about 1.0 nm to about 10 nm, or from about 2.0 nm to about 20 nm, or from about 2.0 nm to about 10 nm, or from about 2.0 nm to about 4.0 nm, for example equal to about 2 nm, or equal to about 3 nm, or equal to about 4 nm, or equal to about 5 nm.

A major advantage of applying such a stress-release layer 1130 is that it reduces mechanical stress at the interface between the soft magnetic material and the semiconductor material (e.g. mainly Si), reduces the risk of delamination, and improves the reliability and/or the life-time of the device.

FIG. 11(d) shows the semiconductor substrate 1100c of FIG. 11(c) after removing all, or at least a major portion of the soft magnetic material 1125 situated outside of the cavity 1126. This removal can be done by chemical and mechanical polishing (CMP), as schematically indicated by a scissors symbol. The result is a semiconductor substrate 1100d with an integrated magnetic flux concentrator 1127 on top of a stress-release material 1130.

Several variants similar to those described for FIG. 10(a) to FIG. 10(d) are possible, alone or in combination, for example:
the cavity 1126 may extend partially into the interconnection stack 1123;
the total height of the deposited layers (including the stress release layer and the soft magnetic material) may be smaller than, substantially equal to, or larger than the height of the layer 1124;
optionally the layer 1124 may be removed from the substrate 1100d, e.g. by etching,
optionally a (further) protection layer or passivation layer may be provided over the substrate 1100d;
optionally an edge of the outer periphery of the cavity may be situated in the vicinity of the at least one horizontal Hall element, rather than a central axis of the cavity;

In summary, FIG. 11(d) thus illustrates a semiconductor substrate 1100d comprising an IMFC structure 1127 as can be obtained by b) making a cavity; and by e) providing a stress release layer; and by c) sputtering a magnetic material; and by d) applying chemical and mechanical polishing (CMP).

FIG. 12(a) to FIG. 12(d) show a variant of FIG. 11(a) to FIG. 11(d), showing intermediate semiconductor substrates 1200a to 1200d associated with another method according to an embodiment of the present invention, which is a variant of FIG. 9. The main differences between the semiconductor substrates of FIG. 12(a)-(d) and FIG. 11(a)-(d) are:
(i) the cavity 1226 of FIG. 12(a)-(d) has upright walls which form an angle φ with respect to the semiconductor substrate, different from 90°, for example in the range from 40° to 85°, as may be obtained for example by anisotropic etching; and
(ii) the semiconductor substrate of FIG. 12(a)-(d) has at least two horizontal Hall elements, and
(iii) the edges of the cavity (rather than the central axis of the cavity) is located in the vicinity of the horizontal Hall elements.

The differences (ii) and (iii) are related to each other, but they are structurally and functionally unrelated to difference (i).

It is an advantage of the embodiment shown in FIG. 12(d) that the IMFC 1227 will experience less mechanical squeezing from the material 1224 on the sidewalls, which is beneficial for its magnetic properties, while at the same time improving mechanical connection, thus reducing the risk of detaching from the semiconductor substrate because of a larger surface area.

In summary, FIG. 12(d) thus illustrates a semiconductor substrate comprising an IMFC structure 1227 as can be obtained by b) making a cavity with slanted edges; and by e) providing a stress release layer; and by c) sputtering a magnetic material; and by d) applying chemical and mechanical polishing (CMP).

FIG. 13(a) to FIG. 13(d) show a variant of FIG. 10(a) to FIG. 10(d), showing intermediate semiconductor substrates 1300a to 1300d associated with another method according to an embodiment of the present invention, which is a variant of FIG. 9.

The main difference between the semiconductor substrate 1300a of FIG. 13(a) and the semiconductor substrate 1000a of FIG. 10(a) is that the semiconductor substrate 1300a of FIG. 13(a) explicitly shows a passivation layer 1328 at its upper surface. The semiconductor substrate 1300a may be a CMOS wafer.

The main difference between the semiconductor substrate 1300b of FIG. 13(b) and the semiconductor substrate 1000b of FIG. 10(b) is that the cavity 1326 of the semiconductor substrate 1300b of FIG. 13(b) extends partially into the interconnection layer 1323, e.g. until it reaches one of metal layers M1-M4. In the example shown, the cavity extends to metal layer M3, which acts as an etch stop.

The main difference between the semiconductor substrate 1300c of FIG. 13(c) and the semiconductor substrate 1000c of FIG. 10(c) is that a plurality of layers 1331.i, 1325.i (where i is an integer number) are applied instead of only one. In the specific example shown, a stack of N times two alternating layers is sputtered: one layer 1332.i being a stress release layer, the other layer 1325.i being or comprising a soft magnetic material, such as e.g. Fe or Ni or FeNi or Fe-based or Ni-based or FeNi-based, or Co-based, or mu-metal or metal-glass, etc. Some or all of the stress release layers 1331.i may have a thickness of about 0.5 nm to about 100 nm, or from about 1 nm to about 20 nm, or from about 2 nm to about 10 nm, and may comprise for example Al or AlN or Al2O3 or SiO2 or Ta2O5 or an Al-based or Si-based or Ta-based material, which may be applied by sputtering. Some or all of the soft magnetic layers 1325.i may have a thickness from about 50 nm to about 1000 nm, or from about 50 nm to about 500 nm, or from about 50 nm to about 200 nm. As mentioned above, the total stack of these sputtered layers may for example have a height in the range from 2.0 μm to 80 μm. If needed, an additional layer may be or needs to be applied on top of the passivation layer 1328 in step a) before making the cavity 1326.

In an embodiment the thickness of some or all of the layers comprising or consisting of a soft magnetic material layer is at least 2.0 times or at least 2.5 times, or at least 3 times, or at least 4 times, or at least 5 times, or at least 7 times, or at least 8 times, or at least 10 times the thickness of one (e.g. the thinnest or the thickest or the average or median thickness) of the metal layers (M1-M3 or M1-M4) of the interconnection stack.

As can be appreciated from FIG. 13(c) and FIG. 13(d), if the total thickness of the stacked layers deposited in the cavity 1326 is less than the sum of the penetration depth inside the interconnection stack 1323 and the height of the passivation layer 1328 and any additional layers applied on top thereof, the polishing does not physically contact the stacked layers. As mentioned above, this may be beneficial for the magnetic properties of the stack. Since the stack of layers 1327 has soft magnetic properties, it is also referred to herein as integrated magnetic flux concentrator "IMFC".

It is an advantage of the embodiment shown in FIG. 13(d) that:
(i) the original passivation layer 1328 is left mainly intact, hence the addition of another passivation layer over the substrate may optionally be omitted, and
(ii) that the IMFC 1327 is partially embedded in the interconnection stack 1323, which may provide a good mechanical grip, thus results in a reduced risk of detachment, without providing too much mechanical pressure from the sidewalls;
(iii) that the IMFC 1327 comprises a plurality of N times two alternating layers, one being a stress-release layer, the other being a soft magnetic material. This offers the best of both worlds: a stack which is flexible enough to absorb some mechanical pressure/stress, and which has good magnetic properties. The IMFC 1327 may thus comprise a total number of 2*N layers, N being an integer value of at least 2, e.g. in the range from 2 to 100, e.g. in the range from 5 to 50, or in the range from 10 to 40, or in the range from 15 to 30, e.g. equal to about 20, or equal to about 25.

In summary, FIG. 13(d) thus illustrates a semiconductor substrate 1300d comprising an IMFC structure 1327 as can be obtained by b) making a cavity 1326, which extends into the interconnection stack, and by c) sputtering a plurality of N times two layers: one stress release layer, and one soft magnetic layer, and by d) applying chemical and mechanical polishing (CMP).

FIG. 14(a) to FIG. 14(d) show a variant of FIG. 10(a) to FIG. 10(d), showing intermediate semiconductor substrates 1400a to 1400d associated with another method according to an embodiment of the present invention, which is a also variant of FIG. 9.

The main difference between the semiconductor substrates of FIG. 14(a-c) versus the semiconductor substrates of FIG. 10(a-c) is that the semiconductor substrates of FIG. 14(a-c) explicitly show a sacrificial layer or a resist layer 1429 at their upper surface. The semiconductor substrate 1400a may be a CMOS wafer.

Another difference between the method associated with the intermediate substrates of FIG. 10(a-d) and the method associated with the intermediate substrates of FIG. 14(a-d) is that the semiconductor substrate 1400d of FIG. 14(d) is obtained by removing the sacrificial layer or the resist layer, and the sputtered material thereon, by a lift-off process instead of a chemical and mechanical polishing step (CMP).

In preferred embodiments, the top of the deposited layers in the cavity does not reach the bottom of the deposited layers of the sacrificial layer or resist layer, meaning that, in preferred embodiments, the sum of the penetration depth into the interconnection stack (if applied) and the height of the deposited layers is smaller than the height of the layer 1429. This reduces the risk that material deposited on the sacrificial layer or on the resist layer outside of the cavity 1426 is not completely removed by the lift-off process.

In an embodiment, a chemical and mechanical polishing (CMP) step is performed on the semiconductor substrate 1400c to at least partially remove some of the excess material outside of the cavity, and to reduce the risk that some of the excess material would stick to the soft magnetic material 1427 in the cavity.

In summary, FIG. 14(d) thus illustrates a semiconductor substrate 1400d comprising an IMFC structure 1427 as can be obtained by f) providing a resist layer or a sacrificial layer; by b) making a cavity; and by c) sputtering a magnetic material; and by d) lift-off of the sacrificial layer or the resist layer.

The skilled reader having the benefit of the present disclosure will understand from the examples in FIG. 10(a) to FIG. 14(d) that further variants are also contemplated, by combining features from particular steps shown in one embodiment, with steps of other embodiments. For example, in all of the embodiments the cavity may or may not partially extend into the interconnection stack; and/or in all of the embodiments the edges of the cavity may or may not be slanted or inclined; and/or in all of the embodiments a stress-release layer may or may not be applied as the first layer; and/or in all of the embodiments a single magnetic layer may be sputtered or a plurality of at least two alternating layers (a stress-release layer and a soft magnetic layer) may be sputtered.

The present invention also proposes a method wherein first IMC elements, for example 811 of FIG. 8, are created by electroplating, in known manners, and second IMC elements, for example 812 of FIG. 8, are created using a method as proposed by the present invention.

The present invention also proposes a method wherein first IMFC elements, for example 811 of FIG. 8 are com-pletely (or solely) created by electroplating, and second IMFC elements, for example 812 of FIG. 8 are partially created by electroplating, and partially as proposed by the present invention. More specifically, in this embodiment, first a semiconductor wafer would be made wherein first IMFC elements and a lower portion of the second IMFC elements would be created by electroplating, and the electroplated substrate (e.g. semiconductor wafer) would be used in step a) of the method of FIG. 9 of the present invention; then in step f) a sacrificial layer would be deposited, e.g. a photoresist layer; and in step b) a cavity would be created that extends to the top of the (electroplated) lower portion of the second IMFC; and in step c) additional material would be added on top of that lower (electroplated) portion by sputtering. Such a "hybrid method" offers the advantage that a semiconductor substrate can be generated with first and second IMFC elements having different heights. It is noted that the same variants as mentioned above can also be applied here, for example, the cavity may or may not have slanted walls, the top layer of the second IMFC may be a single layer or may comprise a plurality of alternating layers, etc.

For completeness, FIG. 15 is a schematic representation of an integrated transformer 1500 produced by a method according to the present invention. It is known how to create a semiconductor device comprising one or more integrated coils, which therefore does not need to be explained in further detail herein. The main reason for providing the drawing of FIG. 15 is to illustrate that a soft magnetic core 1511 can be implemented inside those coils by using a method according to the present invention. No more details are deemed necessary.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

The invention claimed is:

1. A method of producing a semiconductor substrate comprising at least one integrated magnetic flux concentrator, the method comprising the steps of:
   a) providing a semiconductor substrate having an upper surface;
   b) making at least one cavity in said upper surface;
   c) depositing one or more layers of one or more materials, including sputtering at least one layer of a soft magnetic material inside the at least one cavity and outside the at least one cavity;
   d) removing substantially all of the sputtered soft magnetic material that is situated outside of the at least one cavity, while leaving at least a portion of the sputtered soft magnetic material that is inside said at least one cavity.

2. The method according to claim 1, wherein step d) comprises removing substantially all of the sputtered soft magnetic material that is situated outside of the at least one cavity by applying chemical mechanical polishing.

3. The method according to claim 1, wherein step d) comprises removing substantially all of the sputtered soft magnetic material that is situated outside of the at least one cavity by applying lift-off.

4. The method according to claim 1, wherein step b) comprises: applying a photoresist layer on the upper surface and patterning the photoresist layer.

5. The method according to claim 1, wherein step b) comprises: making said at least one cavity so as to have a predefined first height in a direction perpendicular to the semiconductor substrate; and wherein step c) comprises: depositing said one or more layers over a second height in the direction perpendicular to the semiconductor substrate;

wherein the second height is larger than the first height.

6. The method according to claim 1, wherein step a) comprises: providing a semiconductor substrate comprising at least one magnetic sensor element and an interconnection stack comprising at least three or at least four metal layers; and wherein step b) comprises: making said at least one cavity so as to extend at least partially into said interconnection stack.

7. The method according to claim 6, wherein step b) comprises: making said at least one cavity so as to extend to one of the metal layers of the interconnection stack.

8. The method according to claim 1, wherein step c) comprises: depositing a polymer layer, or polyimide, or a stress release layer as a first layer of said one or more layers.

9. The method according to claim 1, wherein step c) comprises: providing at least one layer of Al or AlN or $Al_2O_3$ or $SiO_2$ or $Ta_2O_5$ or an Al-based or Si-based or Ta-based material directly below said layer of soft magnetic material; and/or wherein step c) comprises: providing at least one layer of Al or AlN or $Al_2O_3$ or $SiO_2$ or $Ta_2O_5$ or an Al-based or Si-based or Ta-based material directly on top of said layer of soft magnetic material.

10. The method according to claim 1, wherein step c) comprises: forming a stack of layers by repeating at least two times:
  i) sputtering a stress release layer; and
  ii) sputtering a layer of a soft magnetic material.

11. The method according to claim 1, wherein step b) comprises: making said at least one cavity with inclined sidewalls forming an angle with the semiconductor substrate different from 90°; or wherein step b) comprises: making said at least one cavity with rounded or curved sidewalls.

12. The method according to claim 1, wherein step a) comprises: providing a semiconductor substrate comprising at least one or at least two horizontal Hall elements; and wherein step b) comprises: making said at least one cavity above said at least one or said at least two horizontal Hall elements, such that the cavity has a shape with an outer edge which is substantially aligned with a geometric centre of said at least one or said at least two horizontal Hall elements.

13. The method according to claim 1, wherein step a) comprises: providing a semiconductor substrate comprising at least one horizontal Hall element; and wherein step b) comprises: making said at least one cavity above said horizontal Hall element, such that the cavity has a shape with a geometric center which is aligned with a geometric centre of the horizontal Hall element.

14. A method of producing a semiconductor substrate comprising at least one integrated magnetic flux concentrator, the method comprising the steps of:
  a) providing a semiconductor substrate having an upper surface;
  b) making at least one cavity in said upper surface;
  c) forming a stack of layers by repeating at least two times:
    i) sputtering a stress release layer; and
    ii) sputtering a layer of a soft magnetic material;
  d) removing substantially all of the soft magnetic material that is situated outside of the at least one cavity, while leaving at least a portion of the soft magnetic material that is inside said at least one cavity.

15. A method of producing a semiconductor substrate comprising at least one integrated magnetic flux concentrator, the method comprising the steps of:
  a) providing a semiconductor substrate having an upper surface;
  b) making at least one cavity in said upper surface, the cavity having a predefined first height in a direction perpendicular to the semiconductor substrate;
  c) depositing one or more layers of one or more materials over a second height in the direction perpendicular to the semiconductor substrate, including sputtering at least one layer of a soft magnetic material;
  d) removing substantially all of the soft magnetic material that is situated outside of the at least one cavity, while leaving at least a portion of the soft magnetic material that is inside said at least one cavity;
  wherein the second height is larger than the first height.

16. A method of producing a semiconductor substrate comprising at least one integrated magnetic flux concentrator, the method comprising the steps of:
  a) providing a semiconductor substrate having an upper surface, the semiconductor substrate comprising at least one magnetic sensor element and an interconnection stack comprising at least three or at least four metal layers;
  b) making at least one cavity in said upper surface so as to extend at least partially into said interconnection stack;
  c) depositing one or more layers of one or more materials, including sputtering at least one layer of a soft magnetic material;
  d) removing substantially all of the soft magnetic material that is situated outside of the at least one cavity, while leaving at least a portion of the soft magnetic material that is inside said at least one cavity.

17. The method according to claim 16, wherein step b) comprises: making said at least one cavity so as to extend to one of the metal layers of the interconnection stack.

* * * * *